(12) United States Patent
Leigh et al.

(10) Patent No.: US 11,483,943 B2
(45) Date of Patent: Oct. 25, 2022

(54) COMPUTING DEVICE

(71) Applicant: Hewlett Packard Enterprise Development LP, Houston, TX (US)

(72) Inventors: Kevin B. Leigh, Houston, TX (US); John R. Grady, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/862,689

(22) Filed: Apr. 30, 2020

(65) Prior Publication Data

US 2021/0345511 A1 Nov. 4, 2021

(51) Int. Cl.
*H05K 7/20* (2006.01)
*H05K 7/14* (2006.01)
*G02B 6/42* (2006.01)

(52) U.S. Cl.
CPC ......... *H05K 7/1489* (2013.01); *G02B 6/4268* (2013.01); *G02B 6/4278* (2013.01); *G02B 6/4279* (2013.01); *G02B 6/4284* (2013.01); *H05K 7/1492* (2013.01); *H05K 7/20781* (2013.01)

(58) Field of Classification Search
CPC ............. H05K 7/1489; H05K 7/20781; H05K 7/1492; G02B 6/4279; G02B 6/4284; G02B 6/4268; G02B 6/4278
See application file for complete search history.

(56) References Cited

U.S. PATENT DOCUMENTS

| | | | |
|---|---|---|---|
| 6,552,915 B2 * | 4/2003 | Takahashi | H05K 7/1418 361/752 |
| 7,813,143 B2 * | 10/2010 | Dorenkamp | H05K 7/1425 361/797 |
| 7,928,563 B2 | 4/2011 | Bakir et al. | |
| 8,174,826 B2 | 5/2012 | El-Essawy et al. | |
| 8,279,601 B2 | 10/2012 | Lima et al. | |
| 8,730,673 B2 | 5/2014 | Vos et al. | |
| 9,465,179 B2 | 10/2016 | Leigh et al. | |
| 9,646,916 B1 | 5/2017 | Emma | |
| 10,264,701 B1 * | 4/2019 | Norton | H05K 7/1489 |

(Continued)

OTHER PUBLICATIONS

Langari A., Opto-electronic Transceiver Modules, a System Design Perspective, (Research Paper), Aug. 1, 2004, 12 Pgs.

*Primary Examiner* — Stephen S Sul
(74) *Attorney, Agent, or Firm* — Hewlett Packard Enterprise Patent Department

(57) ABSTRACT

A computing device, comprising: a chassis; an optical base layer, including optical connectors; a power base layer, including power connectors; a thermal base layer, including a cold supply line with liquid disconnects, hot return lines with liquid disconnects, and thermal infrastructure interfaces; a radio frequency base layer, including radio frequency connectors; a power interface, wherein the power interface connects to the power base layer; a power supply to connect to the power interface and provide power to the power base layer through the power interface; and bays defined by bay divider walls, wherein each bay divider wall is removable and each bay comprises one of the optical connectors, one of the power connectors, one liquid disconnect for the supply line, one of the liquid disconnects for a hot return line, and one of the radio frequency connectors.

20 Claims, 38 Drawing Sheets

(56) References Cited

U.S. PATENT DOCUMENTS

| | | | |
|---|---|---|---|
| 10,653,036 B1* | 5/2020 | Gao | H05K 7/20236 |
| 10,736,231 B2* | 8/2020 | Bailey | H05K 7/1492 |
| 2007/0023889 A1 | 2/2007 | Salmon et al. | |
| 2008/0310097 A1* | 12/2008 | Sherrod | H05K 7/1492 |
| | | | 361/679.4 |
| 2011/0261526 A1* | 10/2011 | Atkins | H05K 7/1487 |
| | | | 361/679.33 |
| 2013/0025818 A1* | 1/2013 | Lyon | H05K 7/20781 |
| | | | 165/11.1 |
| 2013/0322012 A1 | 12/2013 | Dunwoody et al. | |
| 2014/0202678 A1* | 7/2014 | Goth | F28F 27/02 |
| | | | 165/287 |
| 2015/0173235 A1* | 6/2015 | Ma | H05K 7/183 |
| | | | 361/679.58 |
| 2016/0150681 A1* | 5/2016 | Leigh | H05K 7/20509 |
| | | | 361/679.46 |
| 2016/0205804 A1* | 7/2016 | Hartman | G06F 1/187 |
| | | | 361/679.31 |
| 2017/0082460 A1* | 3/2017 | Dias | H05K 7/1498 |
| 2017/0303439 A1* | 10/2017 | Cader | H05K 7/20836 |
| 2017/0351578 A1* | 12/2017 | Cartes | G06F 11/1435 |
| 2018/0151975 A1* | 5/2018 | Aoki | G06F 8/654 |
| 2018/0368277 A1* | 12/2018 | Bachar | H05K 7/1488 |
| 2019/0327860 A1* | 10/2019 | Edwards | H05K 7/20772 |
| 2020/0315052 A1* | 10/2020 | Kamgaing | H01L 25/0655 |
| 2021/0064490 A1* | 3/2021 | Dong | G06F 1/30 |

* cited by examiner

COMPUTING DEVICE

BACKGROUND

High-performance and/or high-bandwidth computing devices include a large number of high-speed signals to be interconnected among high-radix chips via one or multiple stages of high layer-count printed circuit boards (PCBs). While new chip packages and PCBs have increased efficiency, connectivity overhead between chips and logic/memory dies persists.

BRIEF DESCRIPTION OF THE DRAWINGS

Non-limiting examples of the present disclosure are described in the following description, read with reference to the figures attached hereto and do not limit the scope of the claims. In the figures, identical and similar structures, elements or parts thereof that appear in more than one figure are generally labeled with the same or similar references in the figures in which they appear. Dimensions of components and features illustrated in the figures are chosen primarily for convenience and clarity of presentation and are not necessarily to scale. Referring to the attached figures:

DETAILED DESCRIPTION

Figure 1:
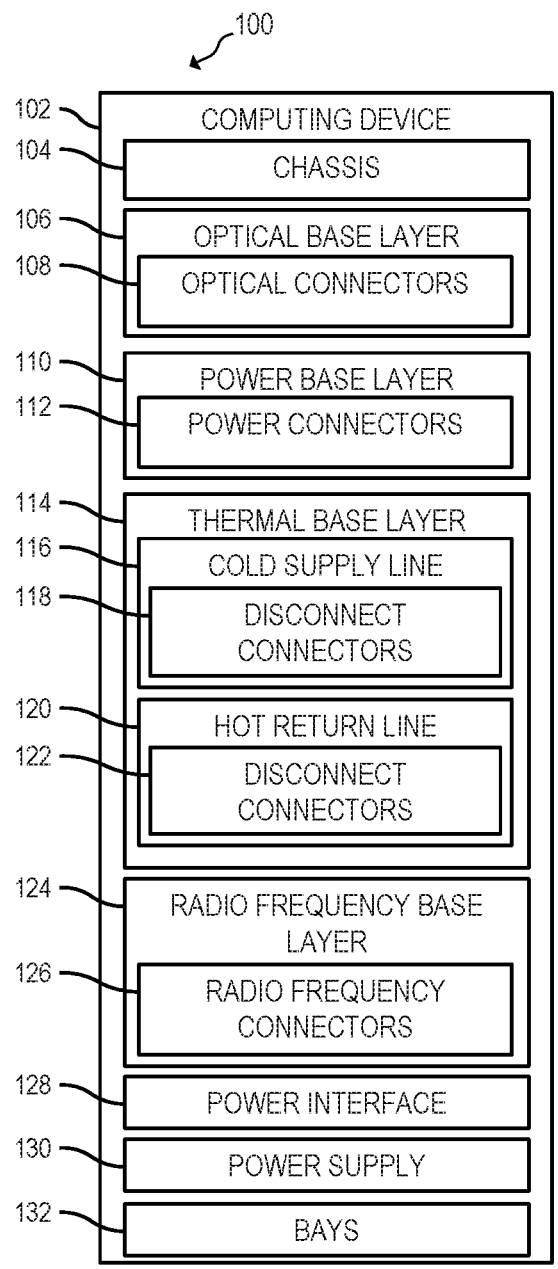
FIG. 1 is a block diagram of a computing device, according to an example.

In the following detailed description, reference is made to the accompanying drawings which form a part hereof, and in which is depicted by way of illustration specific examples in which the present disclosure may be practiced. It is to be understood that other examples may be utilized and structural or logical changes may be made without departing from the scope of the present disclosure.

High-performance and/or high-bandwidth computing devices include a large number of high-speed signals to be interconnected among high-radix chips via one or multiple stages of high layer-count printed circuit boards (PCBs). While new chip packages and PCBs have increased efficiency, connectivity overhead between chips and logic/memory dies persists.

A solution may be to utilize a PCB-less computing device. The computing device may utilize different layers to transmit signals (data, power, management, etc.). Further, the computing device may utilize compact and efficient pluggable modules. Further still, the computing device may utilize optical connectors for high speed communication and pluggable modules for scalability and reliability.

Based on the issues and solutions described above, a new architecture, utilizing base layers, rather than a printed circuit board (PCB), may be utilized. In such examples, a computing device may include a chassis. Rather than including a PCB, such as a motherboard, to route signals and power to various components or pluggable modules, various base layers may be used. For example, a computing device may include an optical base layer. The optical base layer may span the length and width of the chassis and fit into the bottom of the chassis. In such examples, the optical base layer may include optical connectors to connect to and provide input/output (I/O) signals to pluggable modules. Further, the optical base layer may include a signal interface bulkhead. When an optical base layer is installed in a chassis, the signal interface bulkhead may be located at the rear of the chassis and may connect to an optical connector of a rack, larger chassis, or some other structure. Such an optical base layer may reduce cabling and maintenance. Thus, costs for computing devices may be decreased, while efficiency and performance may be increased.

In another example, the computing device may include a power base layer. In an example, the computing device may include a power interface and one or more power supplies. In such examples, power supplies may insert into the rear of the computing device and connect to the power interface. Further, power supplies may include an interface, to connect to an external power source, on one side and an interface, to provide power to bays, on the other side. Further still, a power supply may convert an external power rail (for example, 48V) to power base layer bus bar or cable power levels (for example, 12V). In another example, one or more power supplies may be included for scalability and reliability purposes. In other examples, a power interface, rather than power supplies, may be present and may directly connect to a power source (such as an external bus bar) to provide power to the power base layer bus bar or cables. In such examples, the power interface may connect to or be a part of the power base layer. In another example, the power base layer may include power connectors to connect to and provide power to pluggable modules.

In another example, the computing device may include a thermal base layer. In such examples, the thermal base layer may include two cooling disconnects or liquid disconnects to connect to a supply and return located external to the computing device. In another example, the thermal base layer may include a cold supply line and hot return line. In such examples, cold, cool, or room temperature coolant may flow through the cold supply line to cooling disconnects or liquid disconnects to pluggable modules. The coolant may cool pluggable modules and the warm or hot coolant may flow through another cooling disconnect or liquid disconnect to the hot return line In another example, the computing device may include a radio frequency base layer. In an example, pluggable modules may send and receive management signals. In such an example, the radio frequency base layer may connect to a radio frequency connector on a pluggable module. In another example, the radio frequency base layer may be enclosed within the optical base layer.

In another example, the chassis of the computing device may include bays. Each bay may be defined by divider walls. In an example, the divider walls may be removable to create larger sized bays. In another example, each bay may include at least one optical connector, one power connector, one cooling disconnect or liquid disconnect for the cold supply line, one cooling disconnect or liquid disconnect for the hot return line, and/or one radio frequency connection. In another example, each bay may include a mechanical alignment feature to ensure proper installation of a pluggable module.

FIG. 1 is a block diagram 100 of a computing device 102, according to an example. The computing device 102 may include a chassis 104. The computing device 102 may include an optical base layer 106. The optical base layer 106 may include optical connectors 108 to connect to pluggable modules. The optical base layer 106 may connect to the bottom or floor of the chassis 104. The computing device 102 may include a power base layer 110. The power base layer 110 may include power connectors 112 to connect to the various pluggable modules. The power base layer 110 may also attach to the bottom or floor of the chassis 104. The computing device 102 may include a thermal base layer 114. The thermal base layer 114 may include a cold supply line 116 with disconnect connectors 118 (for example, quick disconnects) to connect to pluggable modules and provide cool, cold, or room temperature coolant. The thermal base layer 114 may also include a hot return line 120 with disconnect connectors 122 (e.g., liquid disconnects) to connect to pluggable modules and return warm or hot coolant to a source external to the computing device 102. The computing device 102 may include a radio frequency base layer 124 with radio frequency connecters 126. The radio frequency base layer 124 may transmit management signals to and from a pluggable module. The computing device 102 may include a power interface 128 and a power supply 130 (or power supplies). The power supply 130 may connect to the power interface 128 and the power interface 128 may connect to the power base layer 110. The computing device 102 may include bays 132 defined by dividing walls. The bays 132 may include at least one of the optical connectors 108, one of the power connectors 112, one of the disconnect connectors 118 (e.g., a liquid disconnect) for the cold supply line 116, one of the disconnect connectors 122 (e.g., a liquid disconnect) for the hot return line 120, and/or one of the radio frequency connectors 126.

In examples described herein, a "processing resource" may include, for example, one processor or multiple processors included in a single computing device or distributed across multiple computing devices. As used herein, a "processor" or "processing resource" may be at least one of a central processing unit (CPU), a semiconductor-based microprocessor, a graphics processing unit (GPU), a field-programmable gate array (FPGA) to retrieve and execute instructions, other electronic circuitry suitable for the retrieval and execution instructions stored on a machine-readable storage medium, or a combination thereof.

As used herein, a "machine-readable storage medium" may be any electronic, magnetic, optical, or other physical storage apparatus to contain or store information such as executable instructions, data, and the like. For example, any machine-readable storage medium described herein may be any of Random Access Memory (RAM), volatile memory, non-volatile memory, flash memory, a storage drive (e.g., a hard drive), a solid state drive, any type of storage disc (e.g., a compact disc, a DVD, etc.), and the like, or a combination thereof. Any machine-readable storage medium described herein may be non-transitory.

As used herein, "hot plug" may refer to the act of adding a component or components to a system while the system is powered on and/or running. Further, hot plug may include the continued operation of the system without significant interruption when the component or components are added. In other words, a device may be added to a system while the system is operating and the user or the system itself may perform an administrative task, so that the added device can be utilized. Hot plug may also be referred to with terms such as, hot pluggable, hot plugging, or hot pluggability. For example, a device may be noted to be "hot pluggable".

As used herein, "hot swap" may refer to the act of replacing, removing, or adding a component or components while the system is powered on and/or running. Further, hot swap may include the continued operation of the system without interruption. In other words, in response to a hot swap operation (for example, replacing one device with a new device), a system may operate as normal without interruption. Hot swap may also be referred to with terms such as, hot swappable, hot swapping, or hot swappability. In other words, a device may be noted to be "hot swappable".

As used herein, "rack unit" or "U" may refer to the unit of measurement to define the height of a rack frame and the height of the equipment in a rack frame (such as, computing devices). Each rack unit may be equivalent to 44.50 millimeters or 1.75 inches. For example, a computing device, such as a rack server, may have a height of 2 U or 2 rack units (in other words, 89 millimeters or 3.5 inches).

As noted above, a computing device 102 may include bays 132. In an example, each of the bays 132 may accept one pluggable module. In another example and as noted above, the bays 132 may be defined by divider walls. In such examples, each of the divider walls may be removable. In such examples, each of the bays 132 may be enlarged by removal of a divider wall adjacent to a bay (in other words, when a divider wall is removed, two bays are combined to create a larger bay). In such examples, the newly enlarged bay may accept a larger pluggable module. For example, a bay may be considered 1×1 and may accept a 1×1 pluggable module. When a divider wall is removed, a bay may be expanded to, for example, a 1×2 bay, a 2×2 bay, and so on. In such an example, larger pluggable modules, such as a 1×2 pluggable module, a 2×2 module, or larger module, may be inserted into the proper sized bay. In another example, each of the bays 132 may include a mechanical alignment feature for a pluggable module. The mechanical alignment may ensure proper installation of a computing or, in other words, each connector of the pluggable module proper mates with each connector of the corresponding bay.

In another example, the radio frequency base layer 124 may be a separate and distinct layer. In another example, the radio frequency base layer 124 may be enclosed in the optical base layer 106. In such examples, wires or wireless transmitters used to transmit and receive radio frequency signals (for example, management signals) may be physically enclosed in the optical base layer 106 (in other words, enclosed in the physical structure that comprises the optical base layer 106).

Figure 2:
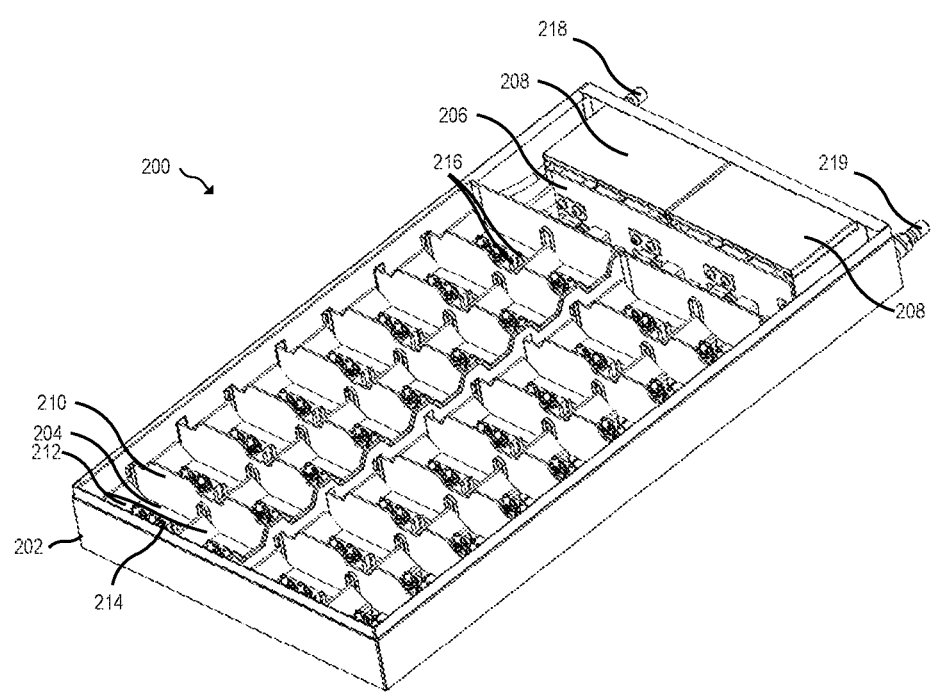
FIG. 2 is a schematic view of a computing device, according to an example.

FIG. 2 is a schematic view of a computing device 200, according to an example. In such examples, the computing device 200 may include a chassis 202. The chassis 202 may be comprised of sheet metal or some other suitable material and may form a bottom or floor and four sides. In an example, the chassis 202, which may be unpopulated (as in, the chassis 202 may not include any pluggable modules), may include a lid (not shown). In another example, when pluggable modules (not shown) are added to the chassis 202, a lid may not fit on the chassis 202. For example, the pluggable modules may sit flush with the top of the chassis 202 or substantially close to flush. In such examples, a chassis may not include a lid when a chassis is fully populated with pluggable modules. Further, if the computing device 200 utilizes liquid cooling, airflow may not be as large a factor in cooling the computing device 200, thus a lid may be superfluous.

In another example, various retention features may be included on the chassis 202. For example, the chassis 202 may include retention features for an optical base layer 204, such as latches or threaded apertures. The chassis 202 may also include similar retention features for the power base layer, thermal base layer, radio frequency base layer, power interface 206, power supplies 208, and divider walls 210. In an example, the retention features may be toolless (for example, a user may push or slide the optical base layer 204 into a chassis 202 until the retention feature are actuated). In another example, the chassis 202 may be a 1 U, 2 U, 4 U, or a different size (smaller or larger) chassis.

In another example and as noted, the computing device 200 may include an optical base layer 204. In an example, the optical base layer 204 may receive and transmit the signals to and from pluggable modules included (or to be included) in the computing device 200. In another example, the optical base layer 204 may also exchange signals among pluggable modules in the computing device 200. In another example, the optical base layer 204 may span the area of the bottom or floor of the chassis 202. In another example, the optical base layer 204 may include optical interface connections 212 for all bays 214. In another example, the optical base layer 204 may include a signal interface bulkhead (not visible). The signal interface bulkhead may connect to an optical interface on a rack, larger chassis, or some other structure and allow for communication of the computing device 200 with other computing devices. In another example, the optical base layer 204 may include components that may transmit and receive optical signals. For example, the component may be a hollow metallic channel coated with an optically transmissive material, glass optical fibers, plastic optical fibers, and/or polymer waveguides. In another example, the optical base layer 204 may be a glass or polymer block formed with waveguides or channels to transmit optical signals. In another example, bare fibers may be deployed in the optical base layer 204. A bare fiber may comprise fiber core, cladding and coating. A traditional optical cable may include several different layers to strengthen and protect "bare" fibers within the optical cable (in other words, the portion to which may transmit and/or receive optical signals). For example, the optical cable may include one or more layers of outer jackets (e.g., PVC), and a strength member (e.g., aramid yarn) around one or more bare fibers. Since the bare fibers may be enclosed in the protected environment of the optical base layer 204, the extra protection layers may be significantly reduced or entirely eliminated, thus reducing extra materials, space, and cost.

In another example, the computing device 200 may include power supplies 208. In an example, the power supplies 208 may receive power via cables connected from a power distribution unit or from a bus bar located at the rear of a rack, in a larger chassis, or some other structure. In another example, the power supplies 208 may connect to a power interface 206. In a further example, the power interface 206 may include logic to regulate the power sent to each pluggable module, as well as ensure that each pluggable module is hot swappable and/or hot pluggable. As noted above, the computing device 200 may include a power base layer. In another example, the power base layer may include power connectors 216 for each of the bays. In another example, two power connectors 216 may be included per bay 214. In such examples, one of the power connectors 216 may be for ground and the other for a sufficient amount of voltage and current to power a pluggable module. In another example, the power base layer may span the area of the bottom or floor of the chassis 202. In another example, the power base layer may run from the power interface 206 down the length of chassis 202. Further, the power base layer may include two cables or two sets of bus bar per row of bays 214 (for example, a row of bays 214 may be defined by the bays 214 located in a row from the front to the back of the computing device 200).

In another example, the computing device 200 may include a thermal base layer. In such examples, the thermal base layer may include a hot return disconnect 218 and cold supply disconnect 219 to connect to sources of coolant external to the computing device 200. Further, the hot return disconnect 218 and cold supply disconnect 219 may be interchangeable. In other words, the hot return disconnect 218 may be used as a cold supply disconnect and the cold supply disconnect 219 may be used as a hot return disconnect. In another example, the thermal base layer may include lines for cold, cool, or room temperature coolant (as in a cold supply line, tube, or pipe) and hot coolant (as in a hot return line, tube, or pipe). In such examples, the coolant may be supplied to each of the bays 214 or, in other words, pluggable module in the computing device 200.

In another example, the computing device 200 may include a number of bays 214. The bays 214 may be defined by divider walls 210. In an example, as divider walls 210 are removed, larger bays may be formed. In other words, as divider walls 210 are removed, larger pluggable modules may be added to the newly formed and larger bays. In an example, a computing device 200 may include 32 bays 214 (as shown in FIG. 2). By removing divider walls 210 between each adjacent bay pair, the computing device 200 will then have 16 larger bays. A computing device 200 may be designed to include more smaller-sized bays or fewer larger-sized bays. In another example, a computing device 200 may be larger than 1 U. In such examples, the computing device may include more than one layer or stacks of bays 214.

Figure 3:
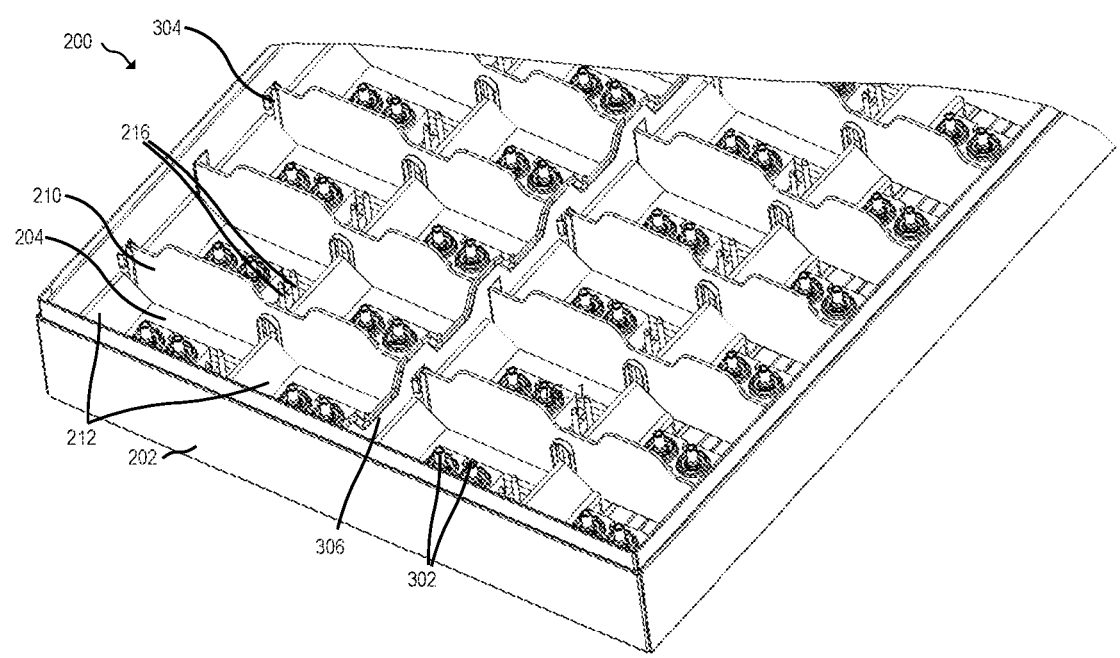
FIG. 3 is a close-up schematic view of a computing device, according to an example.

FIG. 3 is a close-up schematic view of a computing device 200, according to an example. As noted, the computing device 200 may include an optical base layer 204. The optical base layer 204 may include optical interface connections 212. In an example, the optical interface connections 212 may be angled optical interface connectors. In another example, the optical interface connections 212 may be a plug optical connector. In yet another example, the optical interface connections 212 may be a receptacle optical connector. As noted, the computing device 200 may include a power base layer. In such examples, the power base layer may include power connectors 216 for each of the bays 214. In another example, two power connectors 216 may be included per bay 214. In such examples, one of the power connectors 216 may be for ground and the other for a sufficient amount of voltage and current to power a pluggable module. As noted, the computing device may include a thermal base layer. The thermal base layer may include disconnect connectors 302, such as liquid disconnects and/or or quick disconnects. The disconnect connectors 302 for each of the bays 214 may include a hot return disconnect and a cold supply disconnect. In another example, the computing device 200 may include a radio frequency base layer. In such examples, the radio frequency base layer may include a radio frequency connector. In such examples, the radio frequency connectors may connect to a cable capable of transmitting and receiving radio frequency signals. Further, the cable may be enclosed within another base layer, such as the optical base layer 204.

As noted, the computing device 200 may include divider walls 210. The divider walls 210 may fit into a slot on the chassis 202. In another example, the chassis 202 may include retention features 304 to lock the divider walls 210 in place. For example, the retention features 304 may be a latch or a slot to grip the divider walls 210. Further, the act of pulling the divider wall 210 may provide sufficient force to allow for the latch to actuate and allow the divider wall 210 to be removed. In other words, the divider wall 210 may be held in place during movement or operation of the computing device 200, but may be easily removed by a user. In another example, the divider walls may run width-wise, in relation to the computing device 200. In another example, a divider wall 306, in addition to divider walls 210, may fit perpendicular to divider walls 210. In other words, divider wall 306 may run length-wise, in relation to the computing device 200. In another example, more length-wise divider walls may be included in the computing device 200

Figure 4:
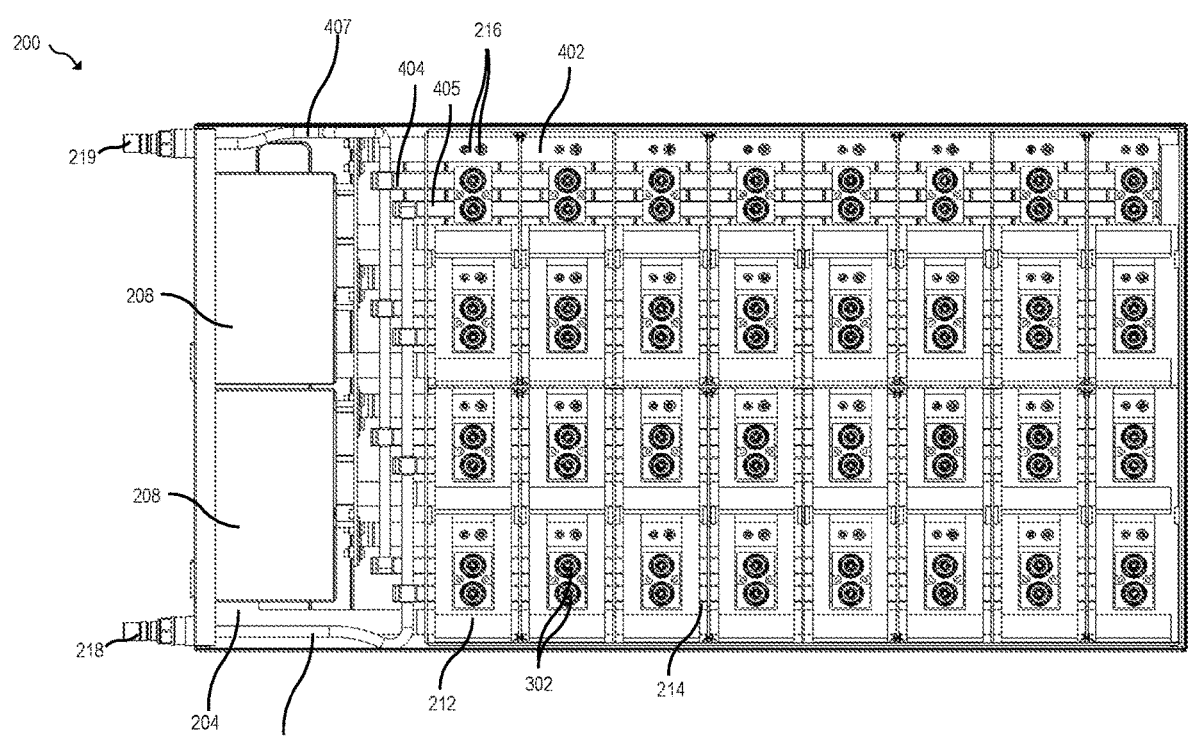
FIG. 4 is a top-down schematic view of a computing device, according to an example.

FIG. 4 is a top-down schematic view of a computing device 200, according to an example. As noted above, the computing device 200 may include a thermal base layer comprising a cold supply line 404 and a hot return line 405. In such examples, the thermal base layer may include a tube 407 or pipe for cold coolant (for example, liquid or air) entering the computing device 200 through the cold supply disconnect 219. In such examples, the tube 407 or pipe may provide coolant to each row of bays 214 via cold supply lines 404. In other words, each row of bays 214 may include a cold supply line 404 which may receive coolant from the tube 407 or pipe. In another example, as the coolant cools a pluggable module, the heated coolant may flow to the hot return line 405. In such examples, the hot return line 405 may transfer the heated coolant to the tube 406 or pipe for heated coolant to leave the computing device 200 through the hot return disconnect 218.

As noted above, the computing device 200 may include a power base layer 402. In such an example, the power base layer 402 may be comprised of bus bar, cables, or some other means sufficient to transfer power from the power interface and power supplies 208 to each row of bays 214. In another example, each row of bays 214 may include an independent section of the power base layer 402. In such examples, each section of the power base layer 402 may connect to the power interface.

Figure 5:
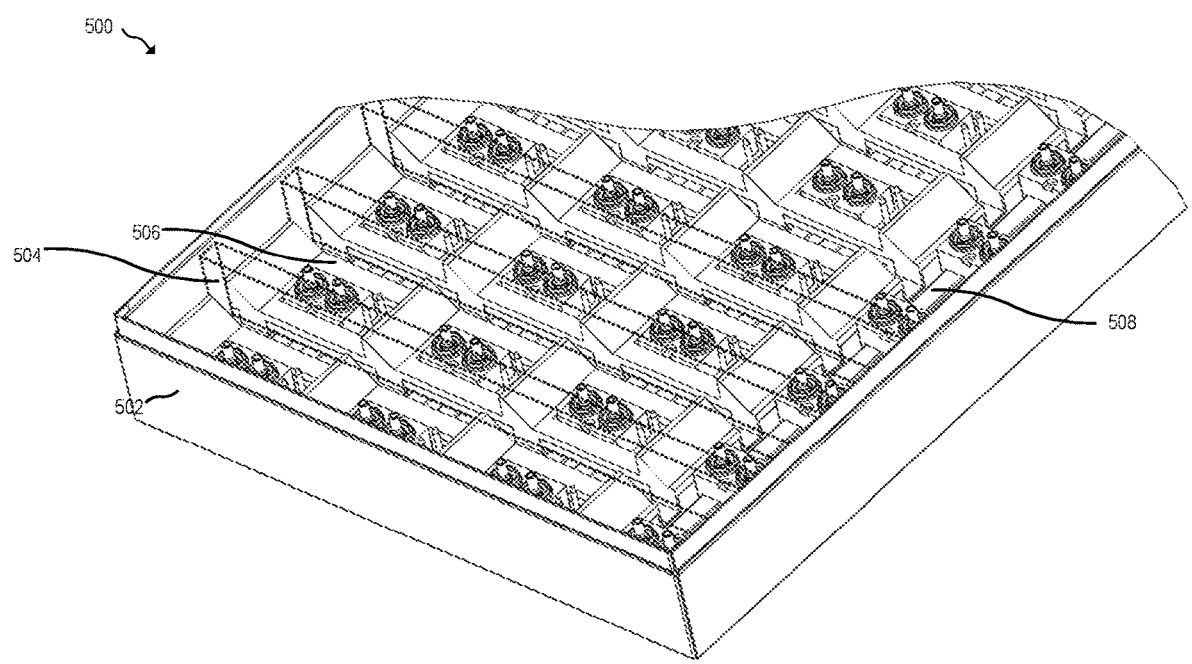
FIG. 5 is a close-up schematic view of a computing device with divider walls removed, according to an example.

FIG. 5 is a close-up schematic view of a computing device 500 with removed divider walls, according to an example. In an example, a computing device 500 may be populated with divider walls prior to installation of pluggable modules. In another example, the computing device 500 may not include divider walls. In such examples, a user may add as many divider walls as they would like. For example, a user may add divider walls to form several two-by-two bays. In another example, the divider walls may be added to slots 504 (represented by the dotted line structure in FIG. 5) of the chassis 502. In another example, the slots 504 may be formed by the grid-like structure formed by the optical base layer 506, thermal base layer 508, and power base layer.

Figure 6:
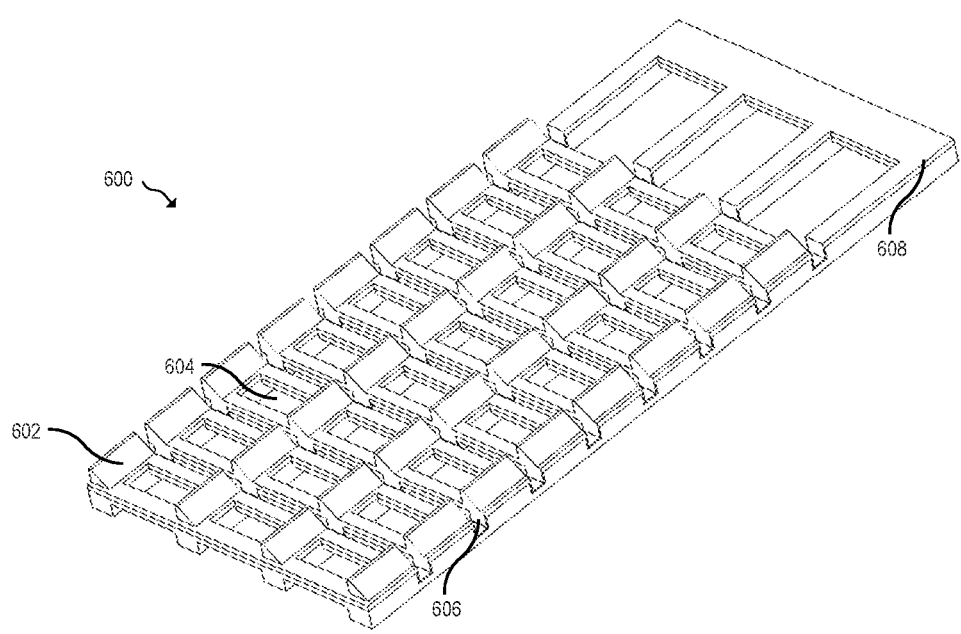
FIG. 6 is a schematic view of an optical base layer, according to an example.

FIG. 6 is a schematic view of an optical base layer 600, according to an example. In an example, the optical base layer 600 may be a single structure. In another example, the optical base layer may be comprised of various structures fitted together or segmented and connected structures. In another example, the optical base layer 600 may be a waveguide. In another example, the optical base layer 600 may be a glass or polymer block with waveguides formed or enclosed within the block. In another example, the optical base layer 600 may include bare fibers routed to each bay. In another example, the optical base layer 600 may include an optical interface 602 for each bay. In an example and as shown, the optical interface 602 may be an angled glass surface with optical connector end-face structure etched. In another example, the optical interface 602 may be an optical blindmate connector plug. In another example, the optical interface 602 may be an optical blindmate connector receptacle. In such examples, each pluggable module may include a complementary optical interface.

In another example, the optical base layer 600 may form a grid-like structure. In such examples, the optical base layer 600 may form a gird-like structure with gaps 604 or voids. The gaps 604 or voids may allow for other components or layers (and connectors or interfaces corresponding to those layers) to pass through, such as a power base layer, a thermal base layer, and/or the radio frequency layer. In another example, the optical base layer 600 may include a signal interface bulkhead 608 located at the rear of the optical base layer 600. In such examples, the signal interface bulkhead 608 may include optical connectors or interfaces. In such examples, when a computing device is inserted in a rack, larger chassis, or other structure, the optical connectors or interfaces may connect to corresponding connectors on the rack, larger chassis, or other structure. In some examples, optical cables may be coupled to the optical interfaces on the signal interface bulkhead 608. Those optical connectors or interfaces may pass data through the corresponding optical connectors or interfaces of the rack, larger chassis, or other structure.

In another example, the optical base layer 600 may include retention features to attach the optical base layer 600 to a chassis. In another example, the optical base layer 600 may include toolless installation features. For example, an optical base layer 600 may be pushed or placed into a chassis top-down and retained therein. In another example, the optical base layer 600 may be slid into a chassis.

Figure 7:
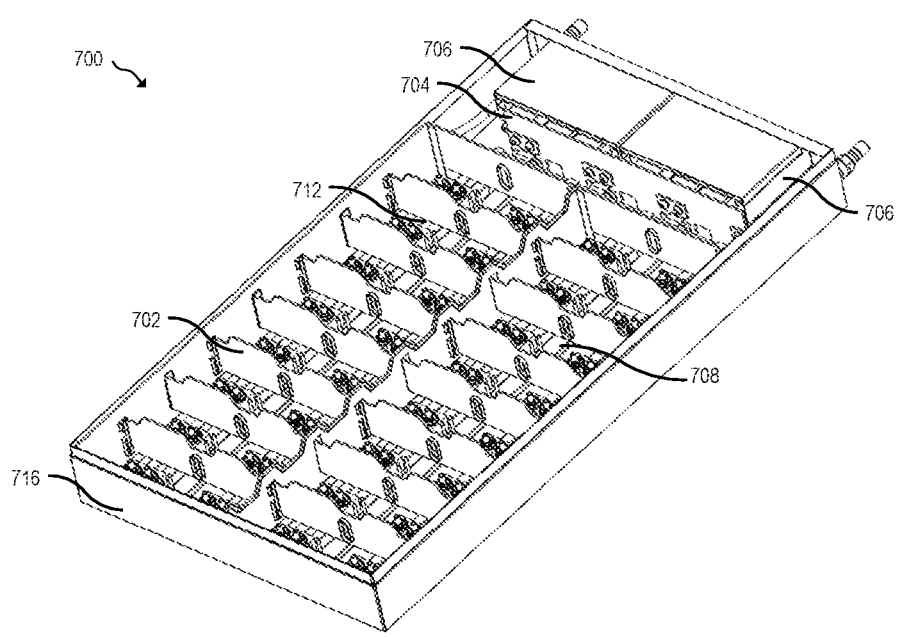
FIG. 7 is a schematic view of computing device with the optical base layer removed, according to an example.
Figure 8:
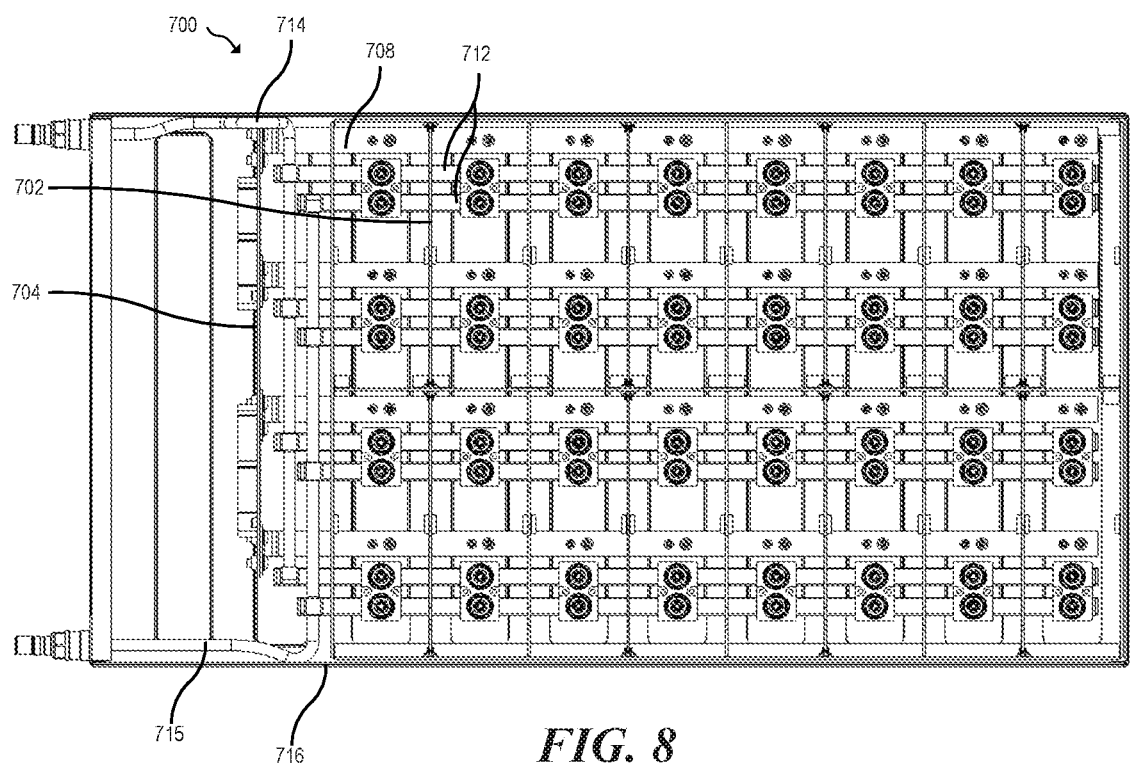
FIG. 8 is a top-down schematic view of computing device with the optical base layer removed, according to an example.
Figure 9:
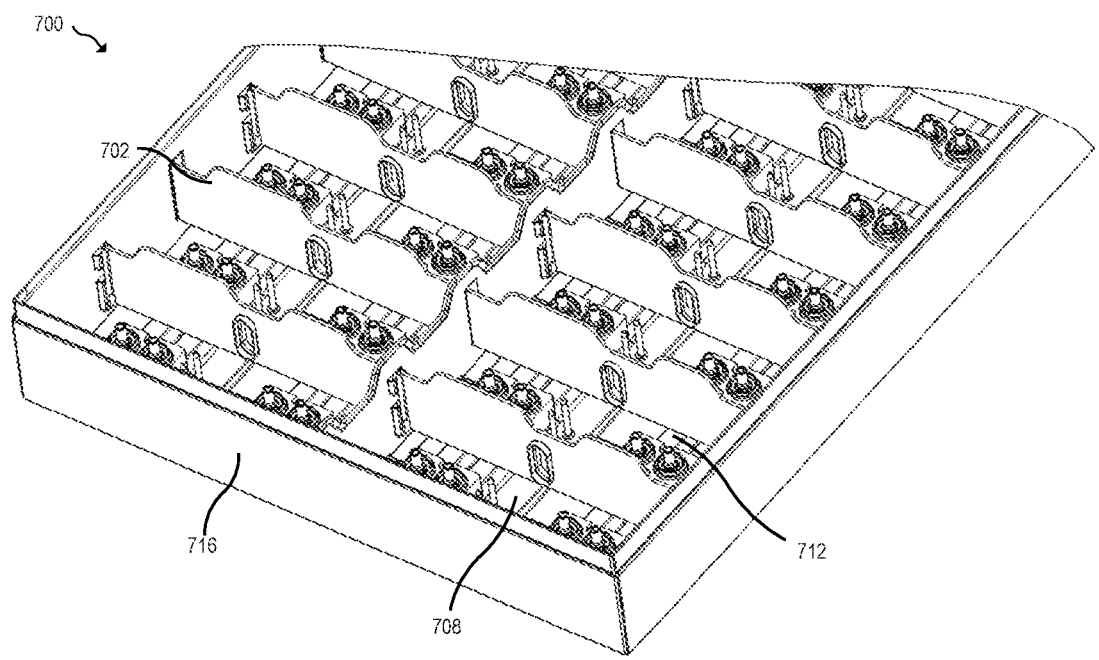
FIG. 9 is a close-up schematic view of a computing device showing a power base layer and a thermal base layer, according to an example.

FIGS. 7 through 9 are schematic views of computing device 700 with the optical base layer removed, according to an example. In such examples, the optical base layer, noted above, may be removable. In such an example, the optical base layer, may be slidable through the rear or through the front of the computing device 700 or may be lifted from the computing device 700. In such examples, the optical base layer may be removed when the divider walls 702, power interface 704, and/or power supplies 706 are first removed. In another example, the computing device 700 may include the power base layer 708 and thermal base layer 712. For example, the power base layer 708 may comprise a series of cables or bus bar connected to the power interface 704 and spanning the length of the rest of the computing device 700. In another example, the thermal base layer 712 may comprise a series of cold supply lines and hot return lines connected to tube 714 (or pipe) and tube 715 (or pipe), respectively, located at the rear of the computing device 700.

In another example, the different base layers may be installed in order when a chassis 716 is first assembled. For example, the thermal base layer 712 may be installed first, followed by the power base layer 708, and followed by the optical base layer. In another example, the chassis 716 may include a removable base pan. In such examples, the different base layers may be removed via removal of the base pan. Other installation and removal orders may be followed in different configurations.

In another example, the thermal base layer 712 and the power base layer 708 may include retention features corresponding to retention features included on the chassis 716. In such examples, the power base layer 708 may be installed in a chassis 716 first and, following installation of the power base layer 708, the thermal base layer 712 may be installed (this operation may be completed in reverse).

Figure 10A:
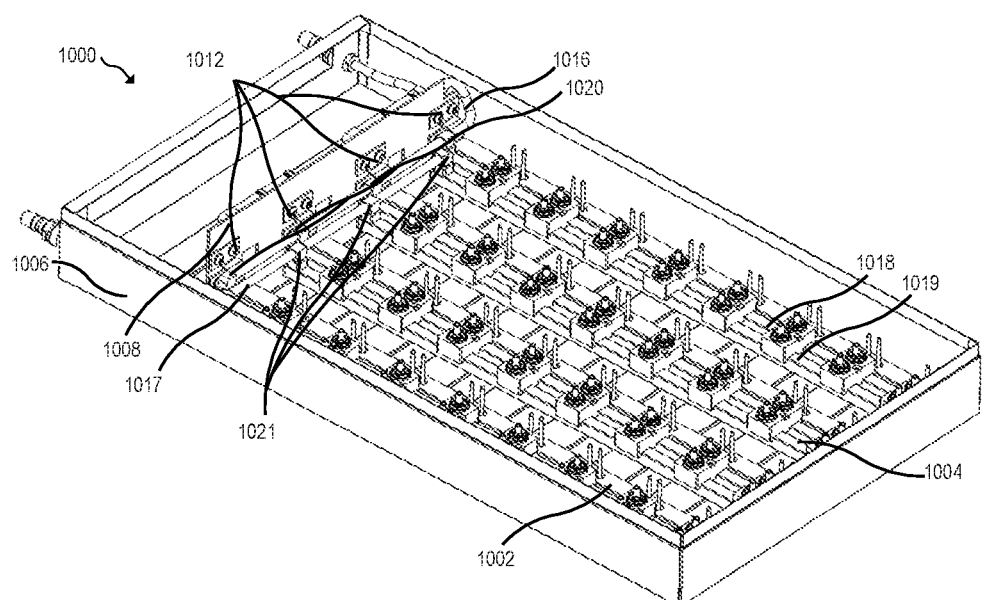
FIGS. 10A and 10B are schematic views of a computing device showing a power base layer and a thermal base layer with divider walls removed, according to an example.
Figure 10B:
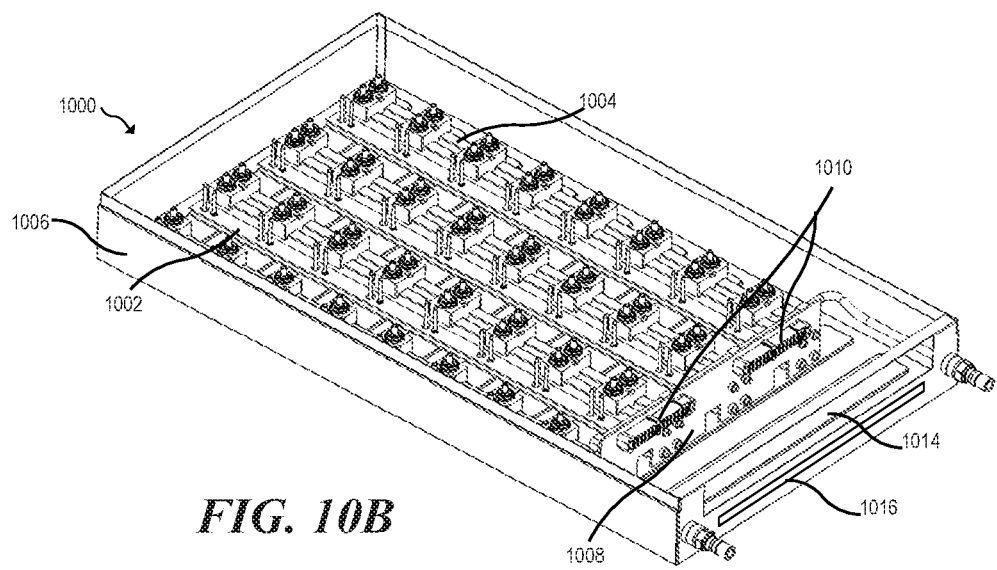

FIGS. 10A and 10B are schematic views of a computing device 1000 showing a power base layer 1002 and a thermal base layer 1004 with divider walls removed, according to an example. As noted above, the power base layer 1002 may attach to the chassis 1006 via retention features. For example, the power base layer 1002 may include apertures that correspond to apertures on the chassis 1006, allowing for screws or other fasteners to pass through and attach to the aperture on the chassis 1006. In another example, the power base layer 1002 may fit into a channel on the chassis 1006. The channel may include retention features to hold the power base layer 1002 in place.

The power base layer 1002 may also connect to the power interface 1008. In such an example, the power interface may include power backplane, power electronics, and power supply connectors 1010. The power supply connectors may be included on the side of the power interface 1008 opposite that of the power base layer 1002. The power base layer 1002 may be electrically coupled to the power interface 1008. In a further example, the power base layer 1002 may connect to the power interface 1008 via screws, other fasteners, toollessly, or via other attachment features. The connection points 1012 between the power interface 1008 and the power base layer 1002 may be connected to the power supply connectors 1010 via traces, planes, wires, or bus bars on the power interface 1008. Other components, such as power electronics including voltage regulators, hot plug controllers, hot swap controllers, or other controllers or microcontrollers (such as system management controller), may be included on the power interface 1008.

In another example, the chassis 1006 may include a slot 1014 for power supplies. In another example, the chassis 1006 may include a slot 1016 for the optical base layer and/or the signal interface bulkhead. In another example, the chassis 1006 may include retention features for the power interface 1008, power base layer 1002, and/or thermal base layer 1004.

As noted above, the thermal base layer 1004 may attach to or be retained by retention features on the chassis 1006. In an example, the thermal base layer 1004 may connect to tubes 1016, 1017 to allow for the supply and return of coolant. In further example, one line of the thermal base layer 1004 may be a cold supply line 1018. In such an example, the cold supply line 1018 may connect to tube 1016 (or pipe) via a distribution connector 1020. In such an example, coolant may flow from tube 1016 through each distribution connector 1020 to each cold supply line 1018. After cooling a pluggable module, the coolant may flow to another line, for example a hot return line 1019. In such an example, heated coolant may flow from the hot return line 1019 through distribution connector 1021 to tube 1017 (or pipe). In an example, tube 1016, tube 1017, cold supply line 1018, and hot return line 1019 may be comprised of a flexible or rigid material. In another example, each connection point in the thermal base layer 1004 may be watertight and may include a sensor in the chassis 1006 to detect leakage. In another example, more sensors may be placed along and below the thermal base layer 1004, e.g., on the base pan, to detect leaks.

Figure 11:
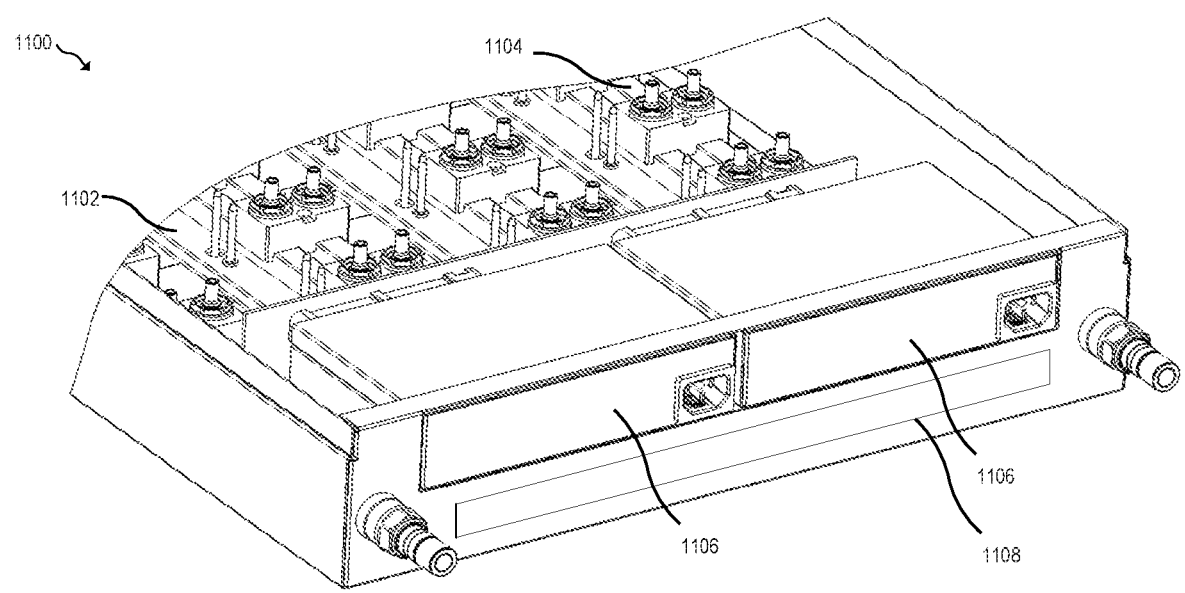
FIG. 11 is another schematic view of a computing device showing a power base layer and a thermal base layer with divider walls removed, according to an example.

FIG. 11 is another schematic view of a computing device 1100 showing a power base layer 1102 and a thermal base layer 1104 with divider walls removed, according to an example. As noted above, the computing device 1100 may include power supplies 1106. In an example, the power supplies may be hot pluggable or hot swappable. In another example, the power supplies 1106 may connect to a rack, larger chassis, other structure, or power distribution unit via cable or direct connection (for example, via a bus bar). In another example, the computing device 1100 may include a slot 1108 for a signal bulkhead interface of an optical base layer.

Figure 12A:
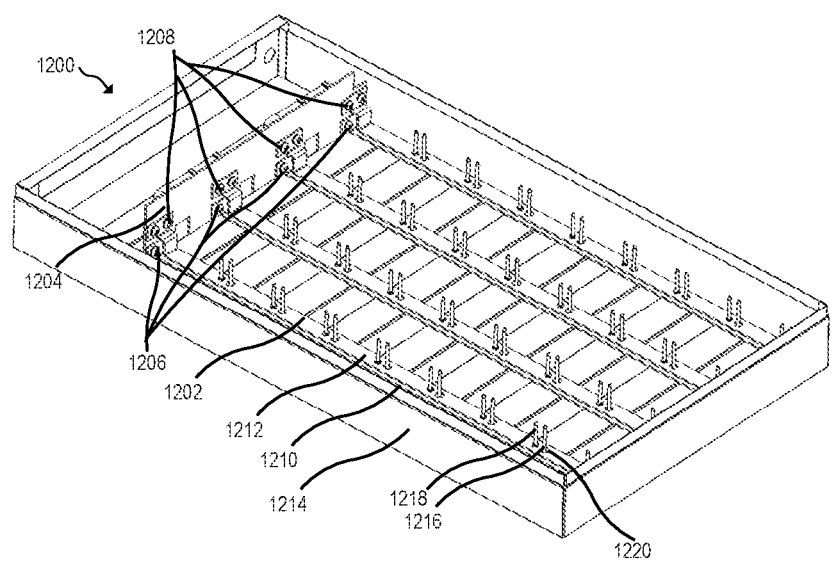
FIGS. 12A and 12B are schematic views of a computing device showing a power base layer, according to an example.
Figure 12B:
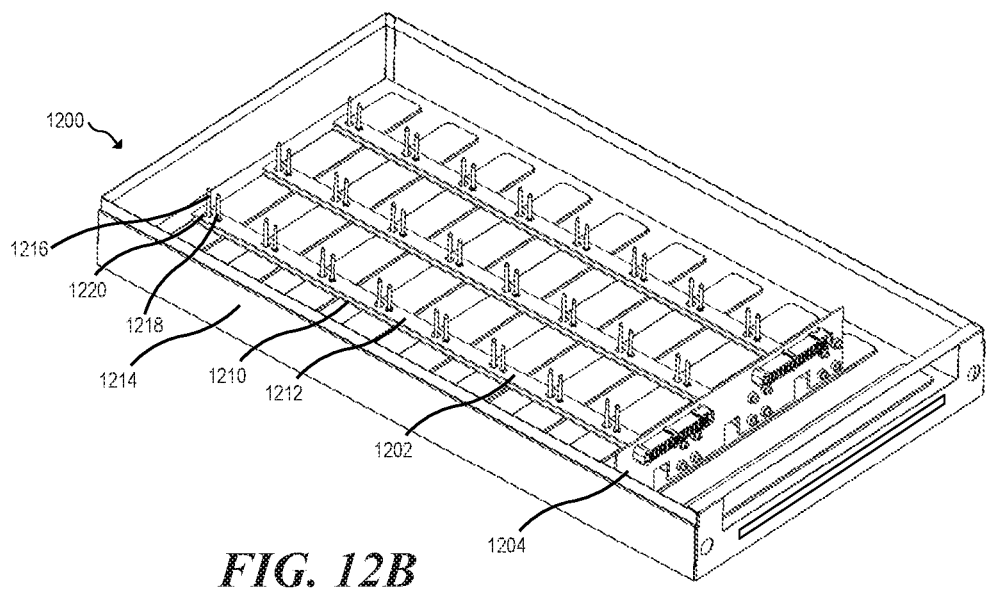

FIGS. 12A and 12B is a schematic view of a computing device 1200 showing a power base layer 1202, according to an example. As noted above the power base layer 1202 may connect to power interface 1204 via various connection points. In an example, the connection points may include ground connection points 1206 and positive connection points 1208. In an example, the power base layer 1202 may include two bus bars 1210, 1212 or cables, for example, a ground bus bar 1210 and a positive bus bar 1212. In such examples, each bus bar 1210, 1212 may span the length between one end of the chassis 1214 and the power interface

Figure 13:
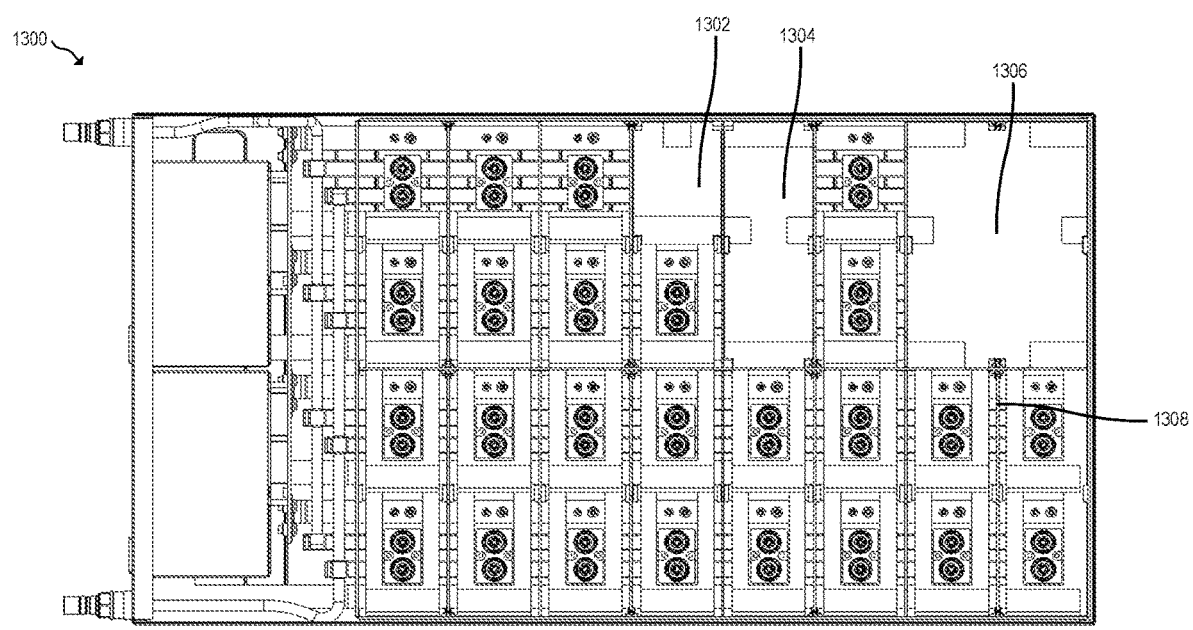
FIG. 13 is a top-down schematic view of a computing device with various pluggable modules, according to an example.
Figure 14:
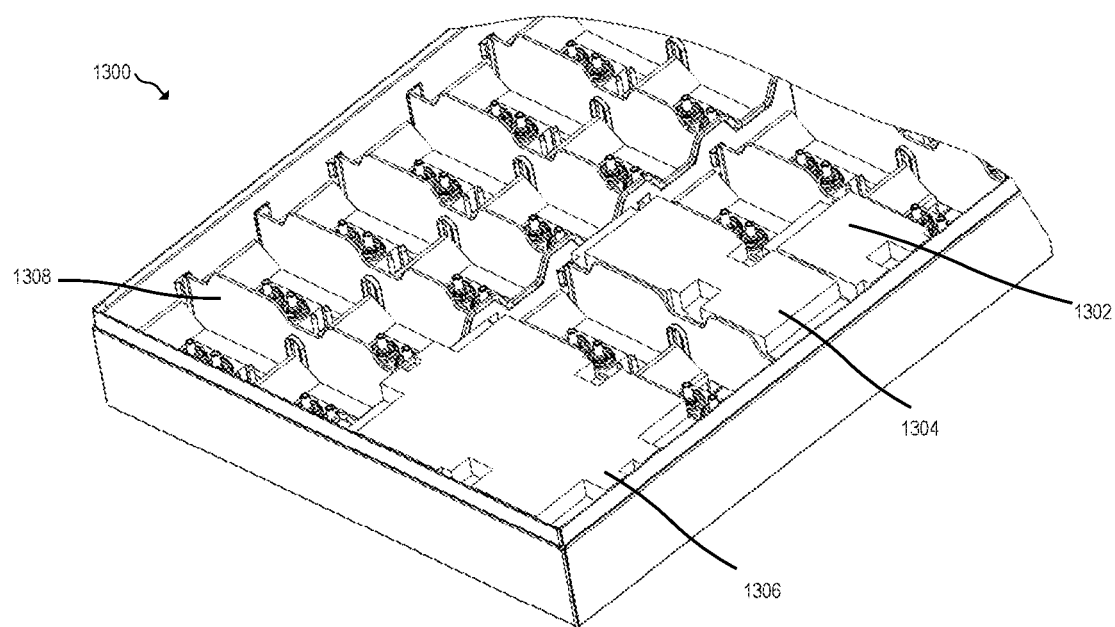
FIG. 14 is another schematic view of a computing device with various pluggable modules, according to an example.

1204. In another example, each bus bar 1210, 1212 may include a power connector 1216, 1218 per bay. For example, the ground bus bar 1210 may be disposed underneath the positive bus bar 1212. Further, a non-conductive material may be disposed between the ground bus bar 1210 and positive bus bar 1212. In another example, each bus bar 1210, 1212 may be coated in a non-conductive material. In another example, the ground power connector 1216 may pass through an aperture 1220 in the positive bus bar 1212. In an example, the number of bus bars 1210, 1212 and number of power connectors 1216, 1218 may vary based on the size of the computing device 1200 and/or the size of pluggable modules to be added to the computing device 1200. FIGS. 13 and 14 are schematic views of a computing device 1300 with various pluggable modules 1302, 1304, and 1306, according to an example. In an example, computing device 1300 may accept varying sizes of pluggable modules 1302, 1304, and 1306. In an example, the computing device 1300 may include 1×1 sized and/or 1×2 sized bays. For example, each bay may be 1×2. In such an example, the 1×2 bay may include features which allow two 1×1 pluggable modules 1302 or one 1×2 pluggable module 1304 to be installed. In another example, the computing device 1300 may include divider walls 1308. In such examples, bay size may be expanded or decreased by removal or addition, respectively, of divider walls 1308. For example, one type of divider wall (not shown), if installed, may be removed to produce a 1×2 bay. Further still, divider wall 1308 may be removed to produce a 2×2 bay. Larger sized bays may be produced. The maximum size of bays may be determined based on the size of the computing device 1300 and/or pluggable modules 1302, 1304, and 1306 to be added to the computing device 1306.

Figure 15:
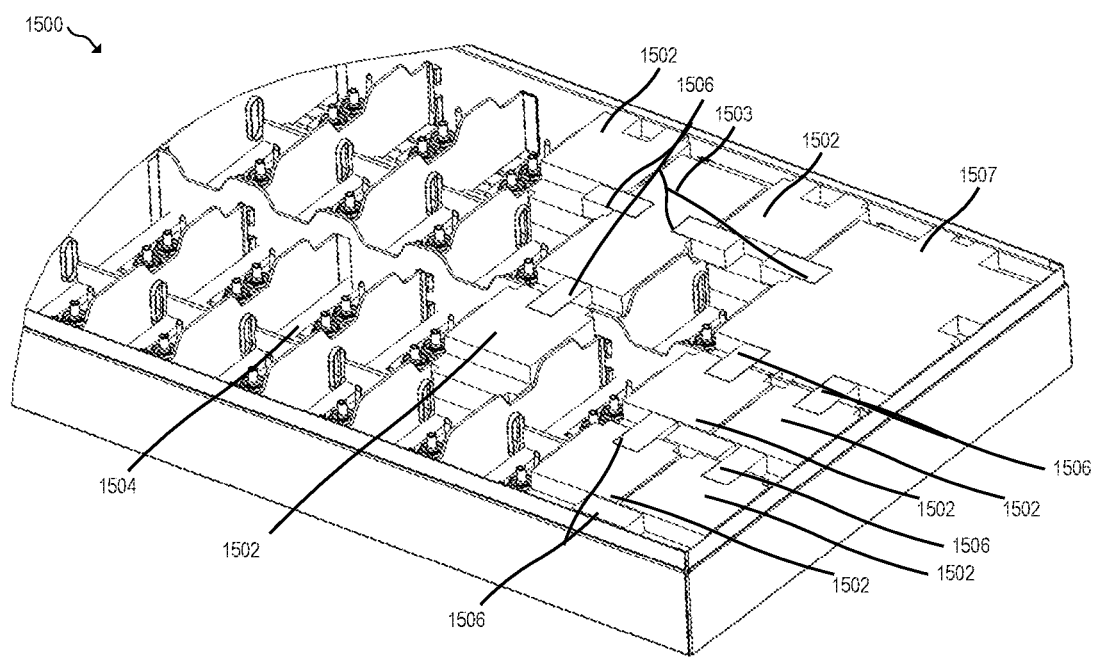
FIG. 15 is another schematic view of a computing device with more pluggable modules, according to an example.

FIG. 15 is another schematic view of a computing device 1500 with various pluggable modules 1502, 1503, and 1507, according to an example. In an example, pluggable modules 1502, 1503, and 1507 may communicate with the other pluggable modules 1502, 1503, and 1507 via the optical base layer 1504. In another example, the pluggable modules 1502, 1503, and 1507 may also communicate with other modules via optical bridges 1506. In such examples, the optical bridges 1506 may be optional components capable of transmitting and receiving optical signals. Further and in such examples, pluggable modules 1502 may not communicate via the optical base layer 1504, rather inter-pluggable module communication may be enabled via the optical bridges 1506. Further still, the optical bridges 1506 may be hot pluggable or hot swappable. Although the optical bridges 1506 are shown as individual components connecting two adjacent pluggable modules, in other examples, an optical bridge 1506 may span across more than two pluggable modules. The optical bridges 1506 may enable a variety of topology options within the computing device 1500.

Figure 16:
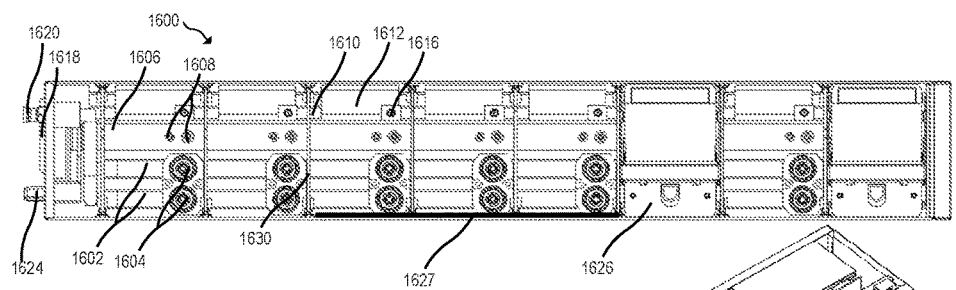
FIG. 16 is a schematic view of a computing device tray, according to an example.
Figure 17:
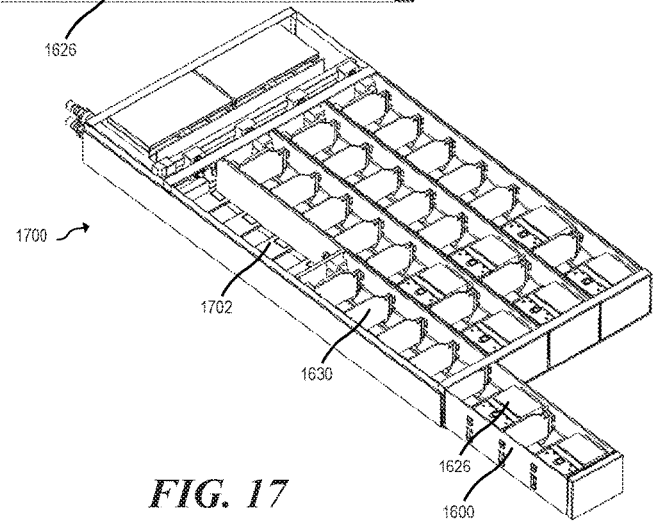
FIG. 17 is a schematic view of a computing device with computing device trays, according to an example.

FIG. 16 is a schematic view of a computing device tray 1600, according to an example. A computing device tray 1600 may include the base layers described above, but, rather than the base layers forming a grid-like structure, the base layers may be configured in a single row. The computing device tray 1600 may include a thermal base layer 1602 (with thermal connectors 1604), a power base layer 1606 (with power connectors 1608), an optical base layer 1610 (with optical interface connectors 1612), and a radio frequency base layer (not shown) (with radio frequency connectors 1616). As noted above, the radio frequency base layer may be enclosed in the optical base layer 1610. In an example, the computing device tray 1600 may include optical blindmate connectors 1618, thermal blindmate connectors 1620, radio frequency blindmate connectors (not shown), and power blindmate connectors 1624 located at the rear of the computing device tray 1600 and to connect to corresponding interfaces in a computing device.

FIGS. 17 through 24 are various schematic views of computing device trays 1600, computing devices 1700 with computing device trays 1600, and the computing device tray power interface connector 1624, according to an example. As noted, the computing device 1700 may contain interfaces or blindmate connections corresponding to interfaces or blindmate connections including on computing device trays 1600. In another example, the computing device 1700 may be 1 U, 2 U, 4 U, or a different size (smaller or larger) device. In another example, the computing device 1700 may include a plurality of slots 1702 to accept computing device trays 1600. In another example, the computing device 1700 may include retention features to lock a fully inserted computing device tray 1600 in place. In other words, when a computing device tray 1600 is inserted into a computing device 1700, the computing device tray 1600 may lock into place in the computing device 1700.

In another example, the computing device tray 1600 may include divider walls 1630. In yet another example, the computing device 1700 may include a computing device tray power interface 1900. The computing device tray power interface 1900 may include connections for the power base layer 1606 of each computing device tray 1600. In another example, each computing device tray 1600 may include a power conversion kit (not shown) to ensure that the computing device tray 1600 may be hot pluggable, hot swappable, and/or receives the correct amount of voltage to power pluggable modules 1626 included in the computing device tray 1600.

In another example, a computing device tray 1600 may include an optical side layer 1627 as shown in FIG. 16. The optical side layer 1627 may span across two or more contiguously adjacent bays and clearing the retention features on the divider walls 1630. In such examples, the optical side layer 1627 may allow pluggable modules 1626 in the computing device tray 1600 that are interfacing to the optical side layer 1627 to communicate.

Figure 18:
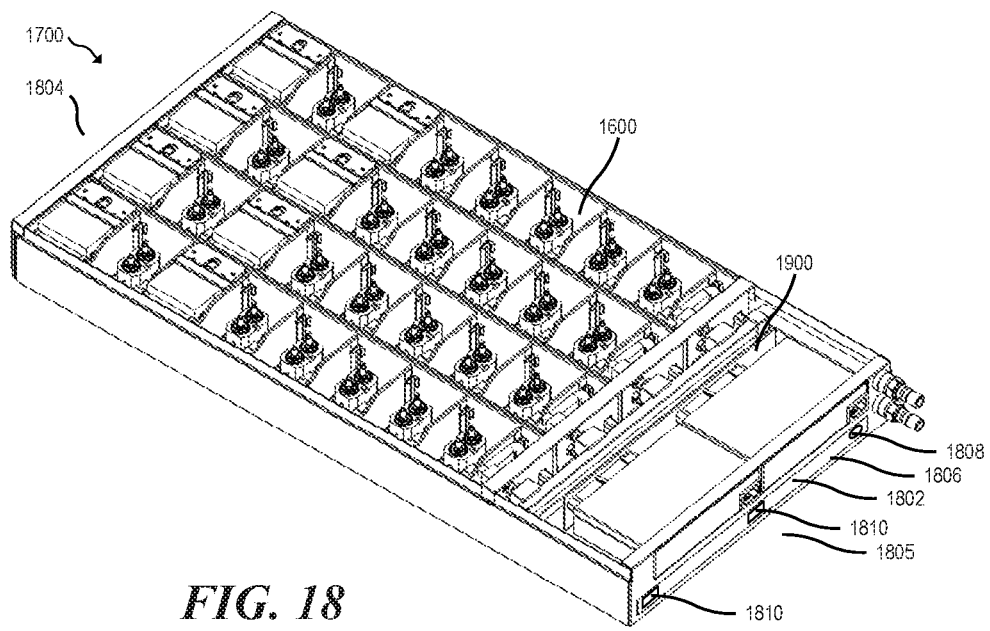
FIG. 18 is another schematic view of a computing device with computing device trays, according to an example.
Figure 19:
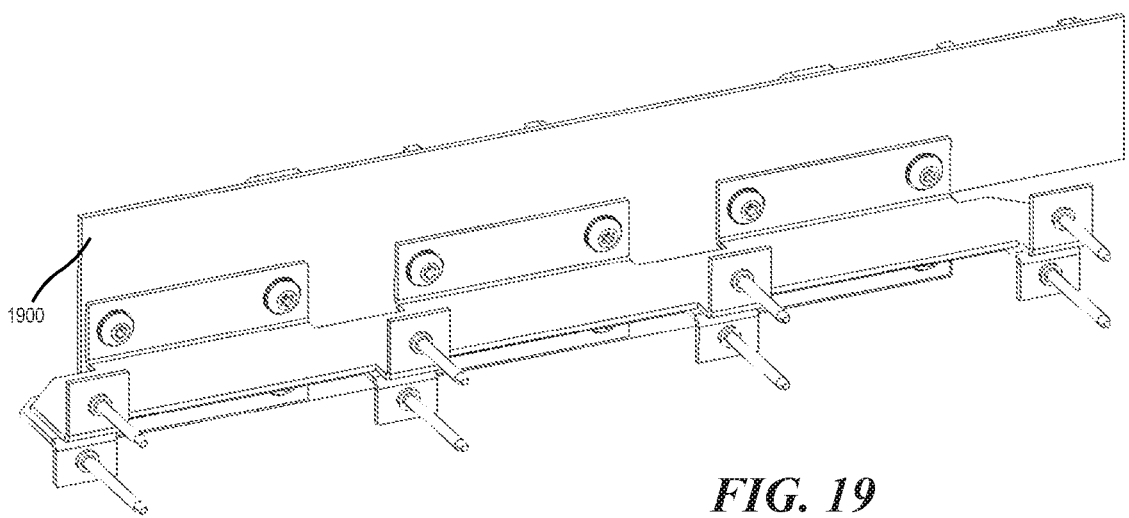
FIG. 19 is a schematic view of a computing device tray power interface, according to an example.
Figure 20:
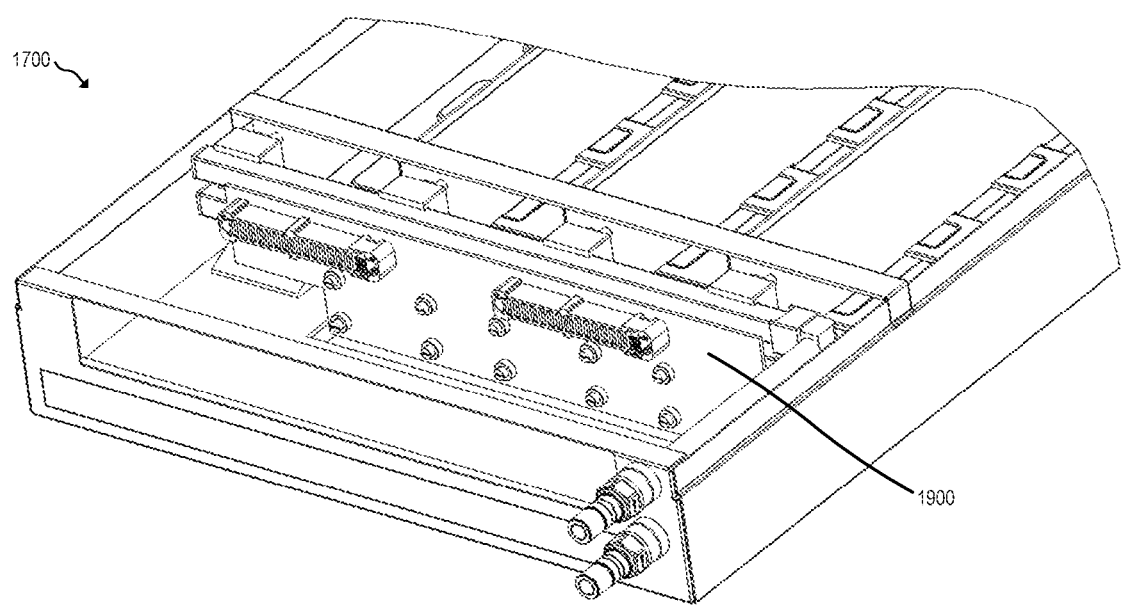
FIG. 20 is a schematic view of the rear of a computing device, according to an example.

In another example, the computing device 1700 may include a signal interface bulkhead 1802 as shown in FIG. 18. In an example, each computing device tray 1600 may connect to one side of the signal interface bulkhead 1802 (in other words, the portion of the signal interface bulkhead 1802 facing towards the front 1804 of the computing device 1700). In another example, the computing device 1700 may include a slot 1806 for the signal interface bulkhead 1802. The other side of the signal interface bulkhead 1802 (in other words, the portion of the signal interface bulkhead 1802 facing the rear 1805 of the computing device 1700) may connect, via optical connectors 1810, to an optical interface of a rack, larger chassis, or some other structure. Further, the other side of the signal interface bulkhead 1802 may connect, via management connector 1808, to a management interface of a rack, larger chassis, or some other structure.

Figure 21:
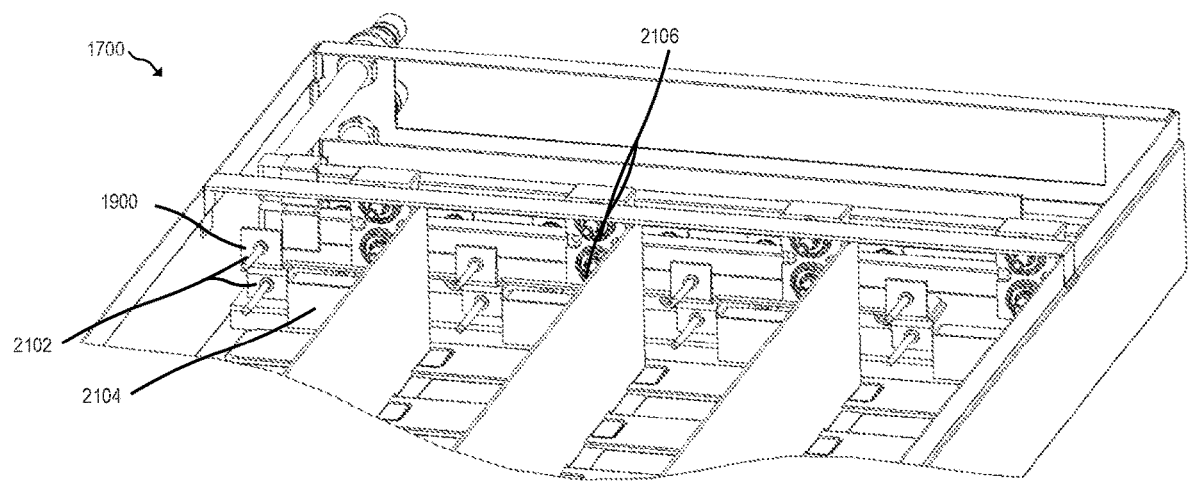
FIG. 21 is another schematic view of the rear of a computing device, according to an example.
Figure 22:
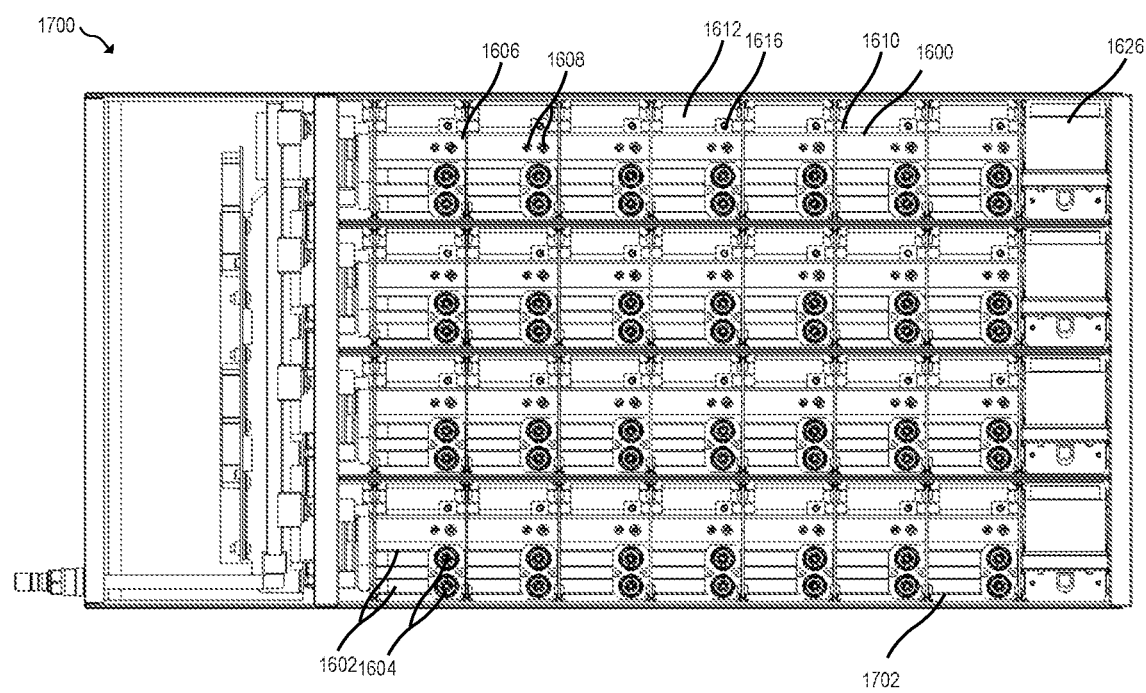
FIG. 22 is a top-down schematic view of a computing device, according to an example.
Figure 23:
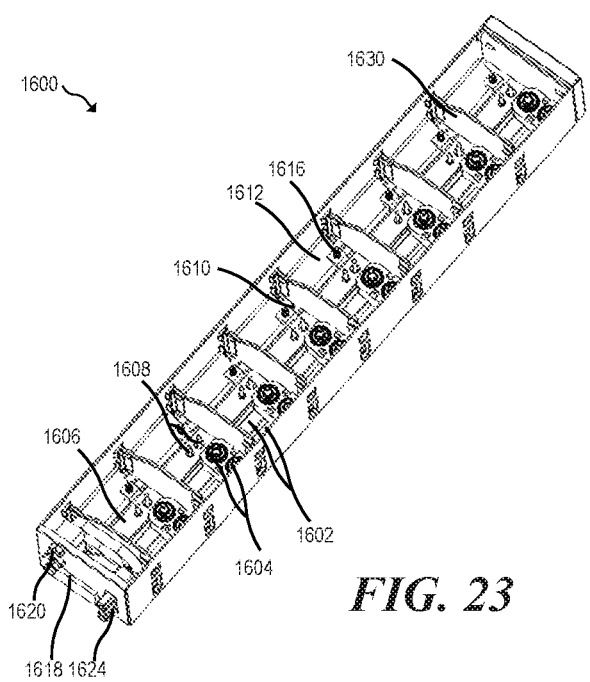
FIG. 23 is another schematic view of a computing device tray, according to an example.
Figure 24:
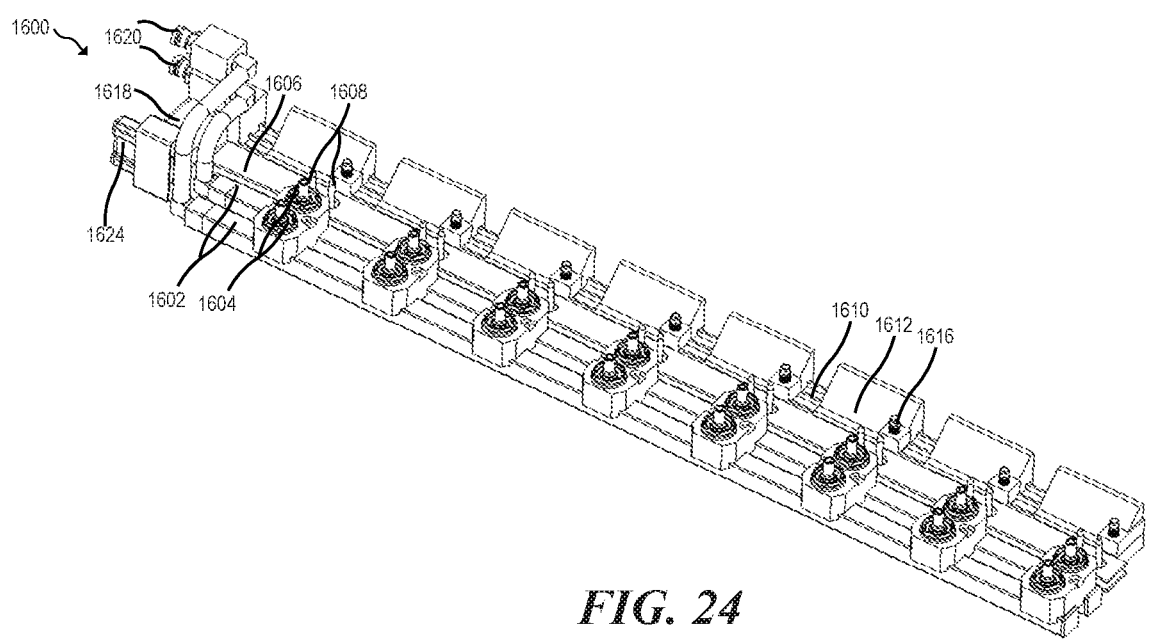
FIG. 24 is a schematic view of a computing device tray without a chassis, according to an example.

As noted above and as shown in FIG. 16, the computing device tray 1600 may include optical blindmate connectors 1618, thermal blindmate connectors 1620, radio frequency blindmate connectors (not shown), and power blindmate connectors 1624 located at the rear of the computing device tray 1600 and to connect to corresponding interfaces in a computing device 1700. For example, the computing device 1700 may include corresponding power blindmate connectors 2102 as shown in FIG. 21. Further, the computing device 1700 may include corresponding optical blindmate connectors 2104. In such examples, corresponding radio frequency blindmate connectors may be enclosed in the corresponding optical blindmate connectors 2104. Further still, the computing device 1700 may include corresponding thermal blindmate connectors 2106.

FIGS. 25A-F is a schematic view of a pluggable module 2500, according to an example. In an example, a pluggable module 2500 may have a top cover 2502 and a bottom cover 2504. In an example, the top cover 2502 and bottom cover 2504 may enclose a substantial portion of the pluggable module 2500. For example, the top cover 2502 may include a cutout or aperture to allow for optical bridges to connect to a top optical base layer via a top optical interface 2506. In another example, the bottom cover 2504 may include apertures for power connectors 2508, thermal connectors 2510, radio frequency connectors 2512, and optical connectors 2514 to pass through. In another example, the top cover 2502 and bottom cover 2504 may connect. In an example, the top cover 2502 and bottom cover 2504 may connect (to substantially enclose the pluggable module 2500) toollessly, such as via a latch. In another example, the top cover 2502 and bottom cover 2504 may connect via fasteners 2516, such as a screw. In such examples, the top cover 2502 and bottom cover 2504 may include corresponding apertures to allow for fasteners 2516 to attach the top cover 2502 and bottom cover 2504 together.

Figure 25A:
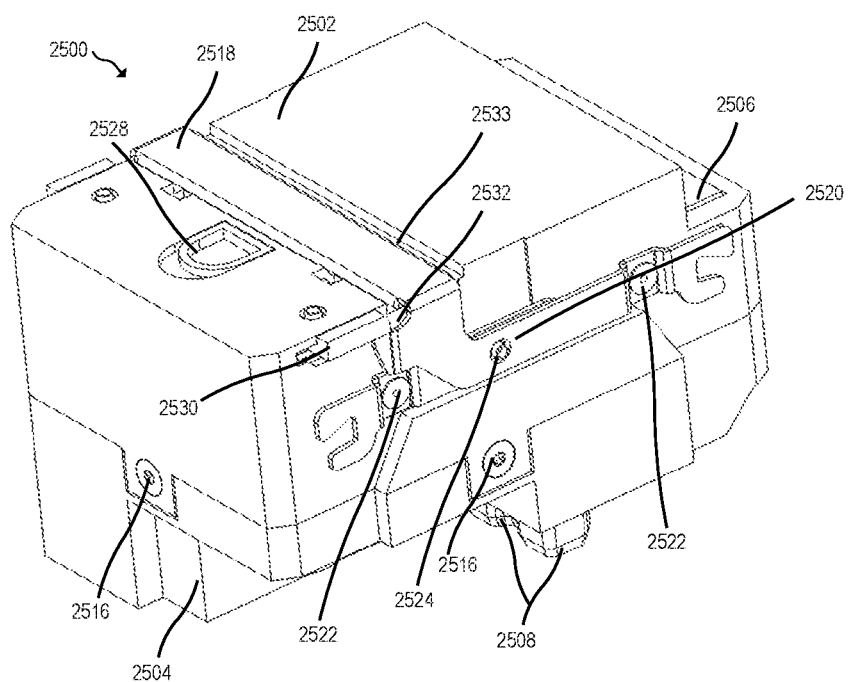
FIGS. 25A-F are schematic views of a pluggable module, according to an example.
Figure 25B:
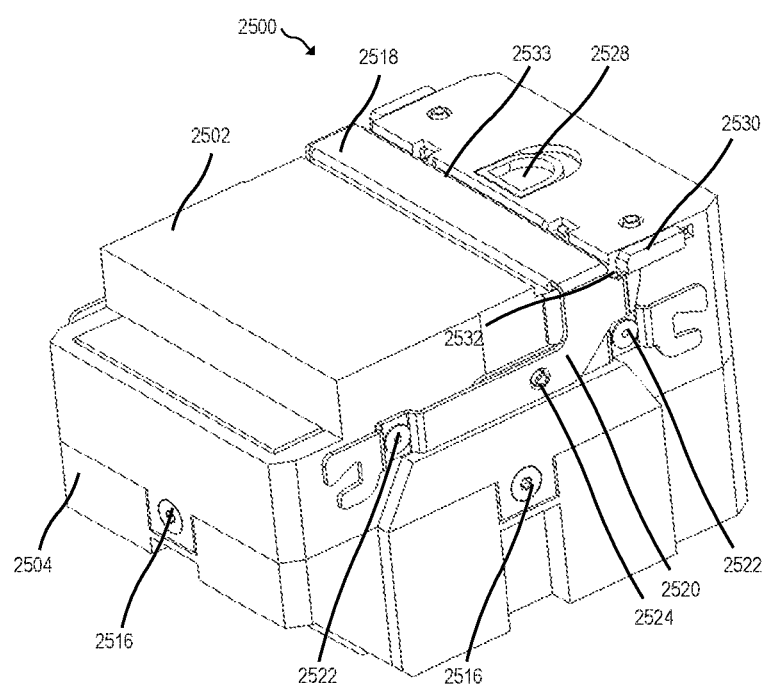
Figure 25C:
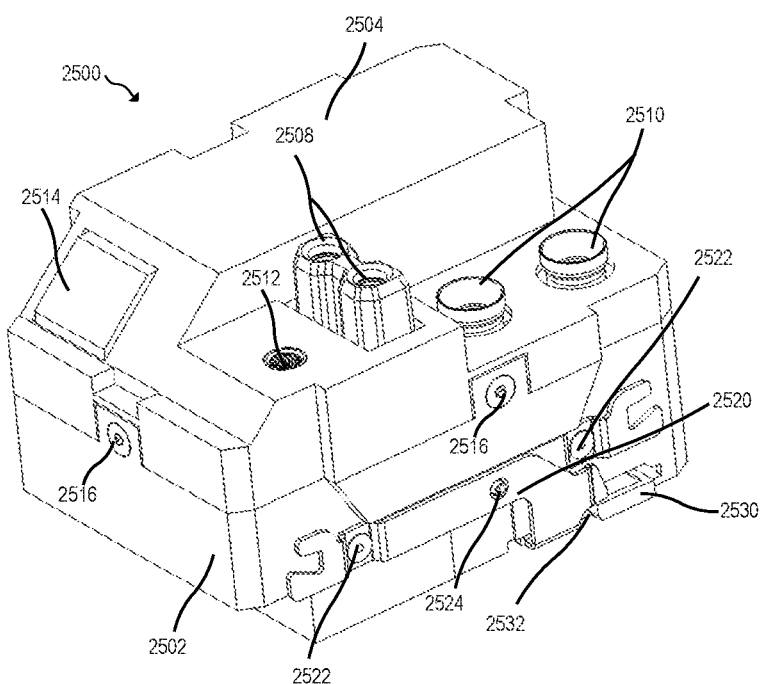
Figure 25D:
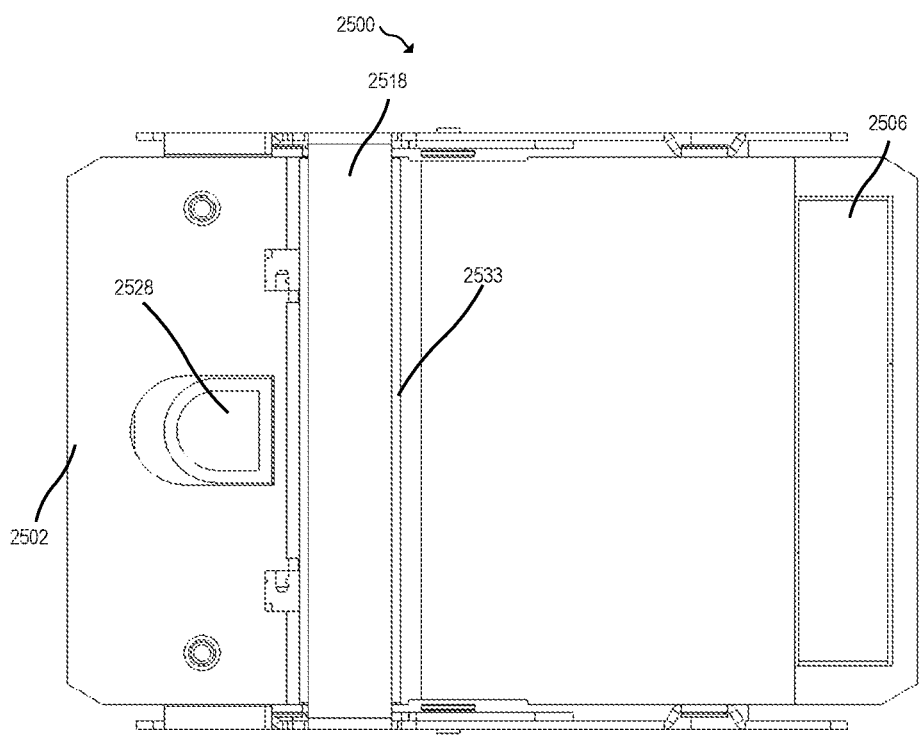
Figure 25E:
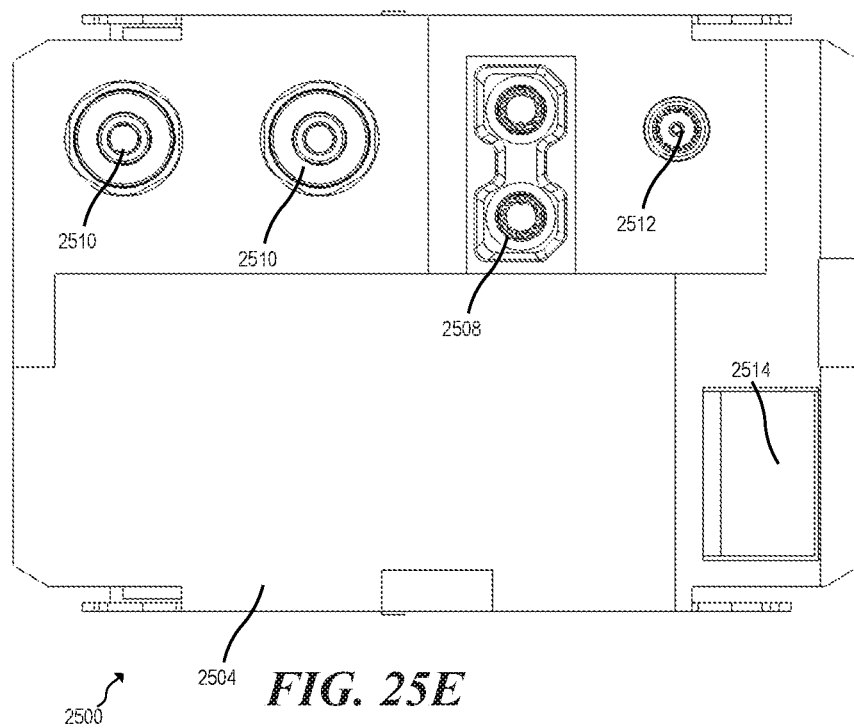
Figure 25F:
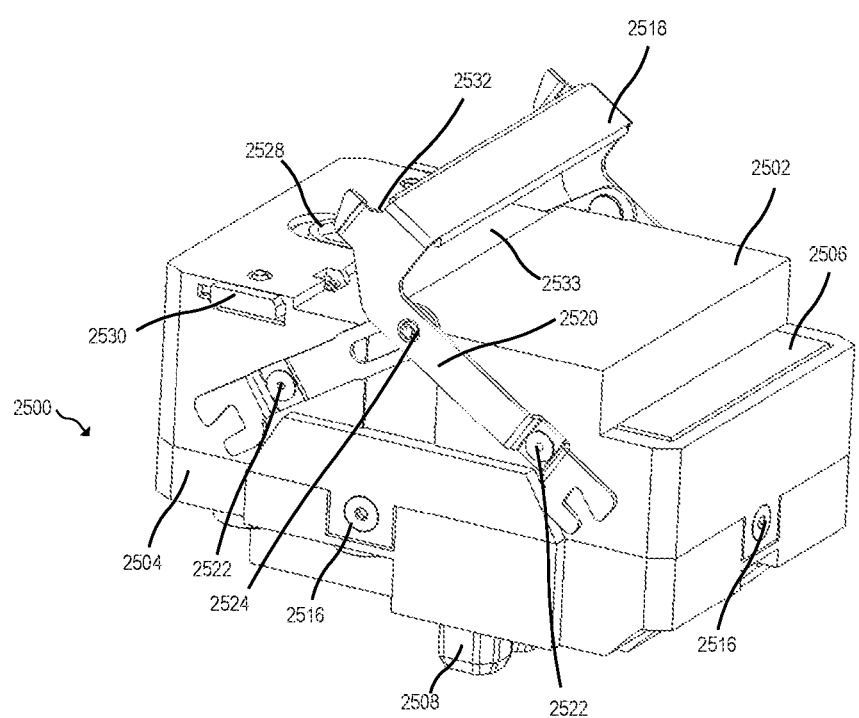

In another example, the top cover 2502 may include retention features corresponding to retention features included on a chassis or computing device tray chassis. In an example, the pluggable modules 2500 retention feature may include a latch. In another example, the pluggable modules 2500 retention feature may include a handle 2518 and hook assembly 2520. In such examples, a handle 2518 may move to an un-latched position as shown in FIG. 25F (for example, when the handle 2518 is in an upwards position that may allow for a user to grab the handle) and a latched position as shown in FIGS. 25A-B (for example, when the handle 2518 may be pushed into or seated in a recess 2533 in the top cover 2502 and locked, the handle 2518 may not be moveable). In such an example, the top cover 2502 may include a sliding lock 2528. In an unlocked position (e.g., FIG. 25F), the sliding lock 2528 may be pushed back and the handle 2518 may be in an unlatched position (e.g., FIG. 25F). In an example, a spring may force the handle 2518 up when the sliding lock 2528 is in an unlocked position (e.g., FIG. 25F). In another example, rather than a spring, the handle 2518 may be movable in an unlocked position (see FIG. 25F). In another example, when the handle 2518 is pulled upwards, to the unlatched position, the handle 2518 may move about a sliding joint 2524 and pivots 2522. In such examples, the hook assembly 2520 may unhook from a chassis retention feature. In another example, when the handle 2518 is pushed into the recess 2533 on the top cover 2502, the hook assembly 2520 may lock onto the retention feature of the chassis. In another example, when the handle 2518 is pushed into the recess 2533, the sliding lock 2528 may slide forward or towards the handle 2518 and lock the handle 2518 in place.

In an example, the sliding lock 2528 may be a moveable button. The button may be moveable back and forth within the top cover 2502. Further, the button (e.g., sliding lock 2528) may be connected to protrusions 2530 located on either side of the top cover 2502. In an example, the handle 2518 may include a notch 2532 on either side and when the sliding lock 2528 is moved into a locked position (see FIGS. 25A-B), the protrusions 2530 may move over the notches 2532, thus blocking actuation of the handle 2518 and preventing removal/addition of the pluggable module 2500 into a computing device or computing device tray.

Figure 26A:
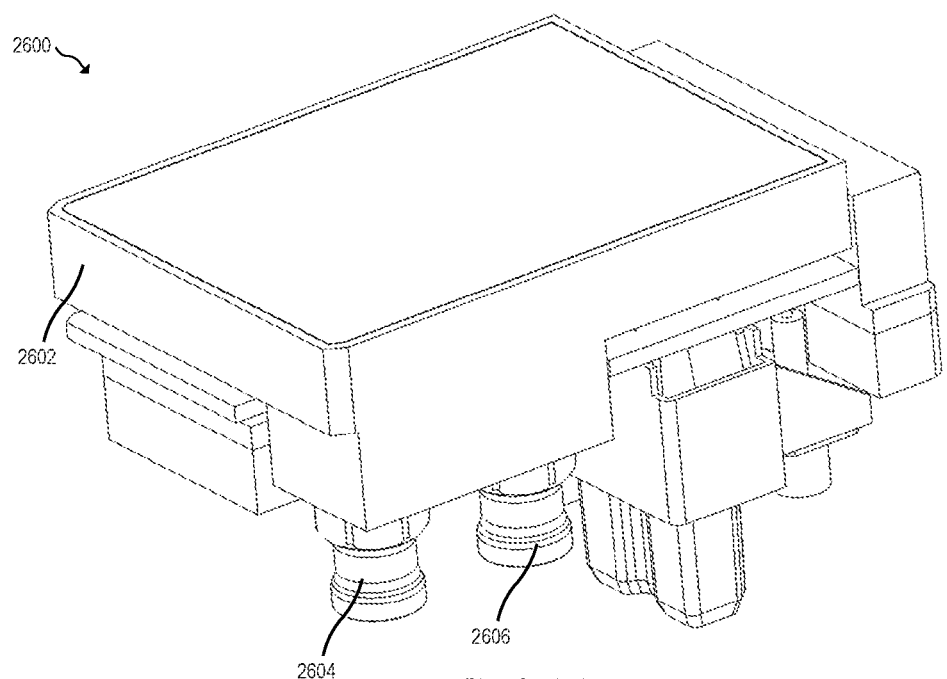
FIGS. 26A-C are schematic views of a pluggable module without a top cover and bottom cover, according to an example.
Figure 26B:
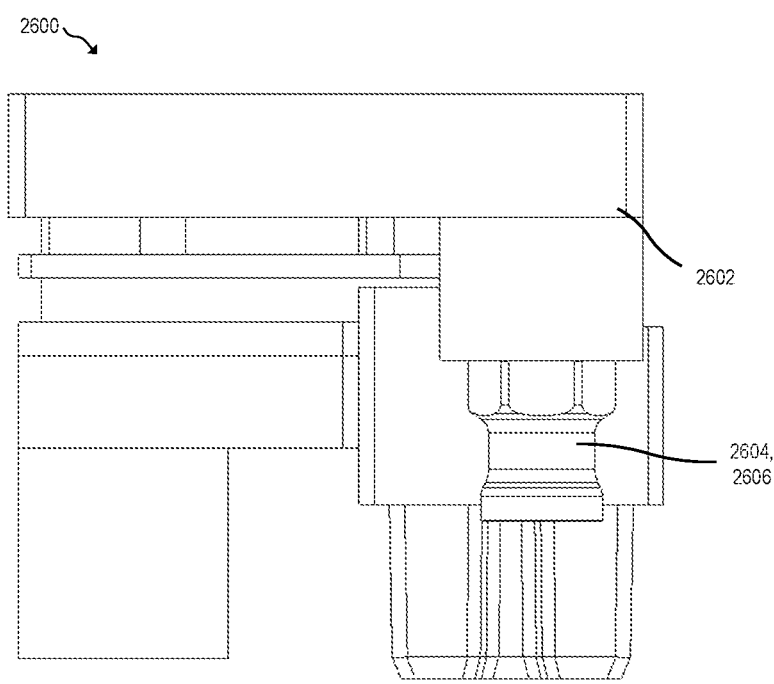
Figure 26C:
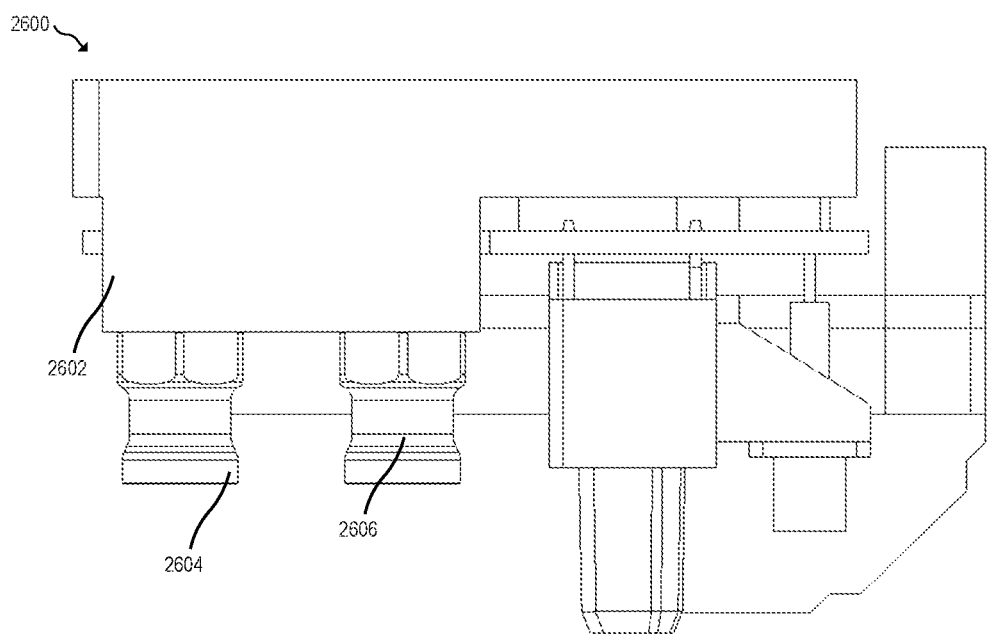

FIGS. 26A-C are schematic views of a pluggable module 2600 without a top cover and bottom cover, according to an example. In such examples, the pluggable module 2600 may include a cooling feature. In an example, the cooling feature may be a cold plate 2602 (other liquid or air-cooling solutions may be utilized). In such examples, heat may be generated by components within the pluggable module 2600. The cold plate 2602 may include thermal connections 2604, 2606 to allow for coolant (such as a liquid, for example, water or some other solution suitable to transfer heat) to flow through the cold plate 2602. As coolant flows through the cold plate 2602 from thermal connection 2604 (or thermal connection 2606), heat may be dissipated from the components within the pluggable module 2600 to the coolant (in other words, heat may be transferred from the heat generating components to the coolant). The heated coolant may flow out of the cold plate 2602 through the thermal connection 2608 (or thermal connection 2604).

Figure 27A:
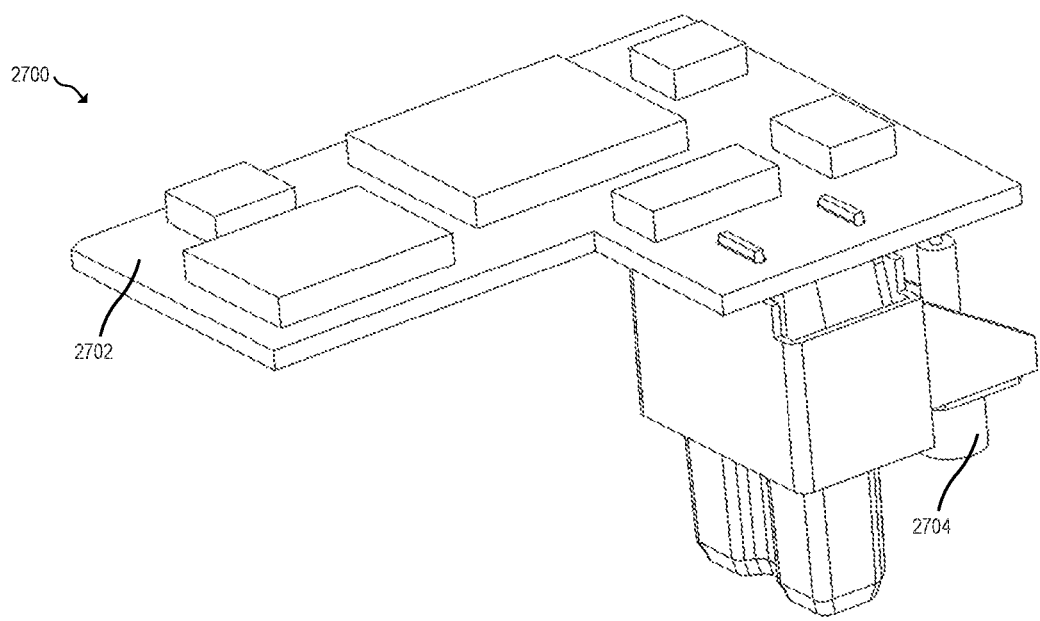
FIGS. 27A-C are schematic views of a pluggable module without a top cover, bottom cover, and cold plate, according to an example.
Figure 27B:
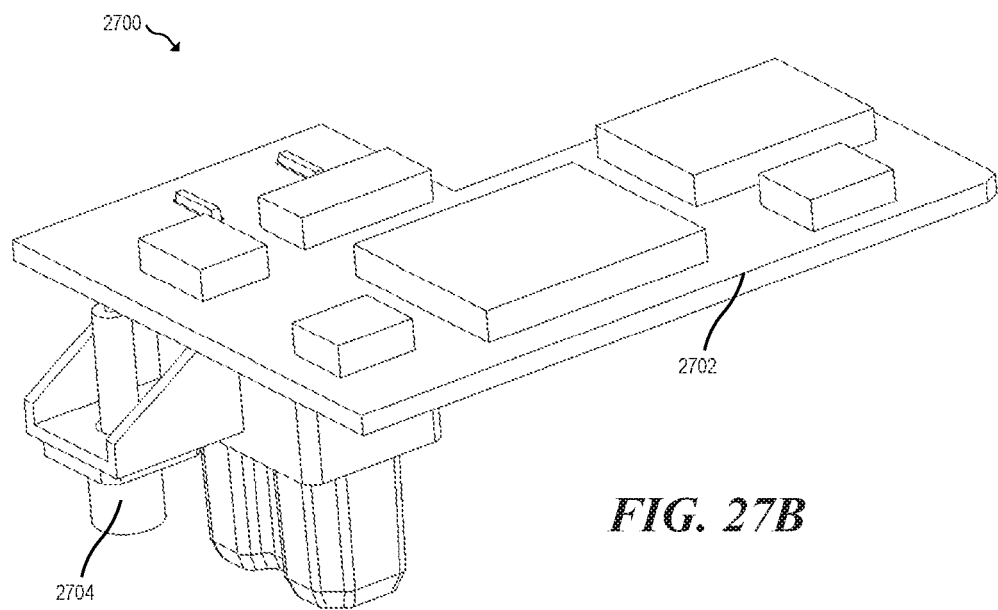
Figure 27C:
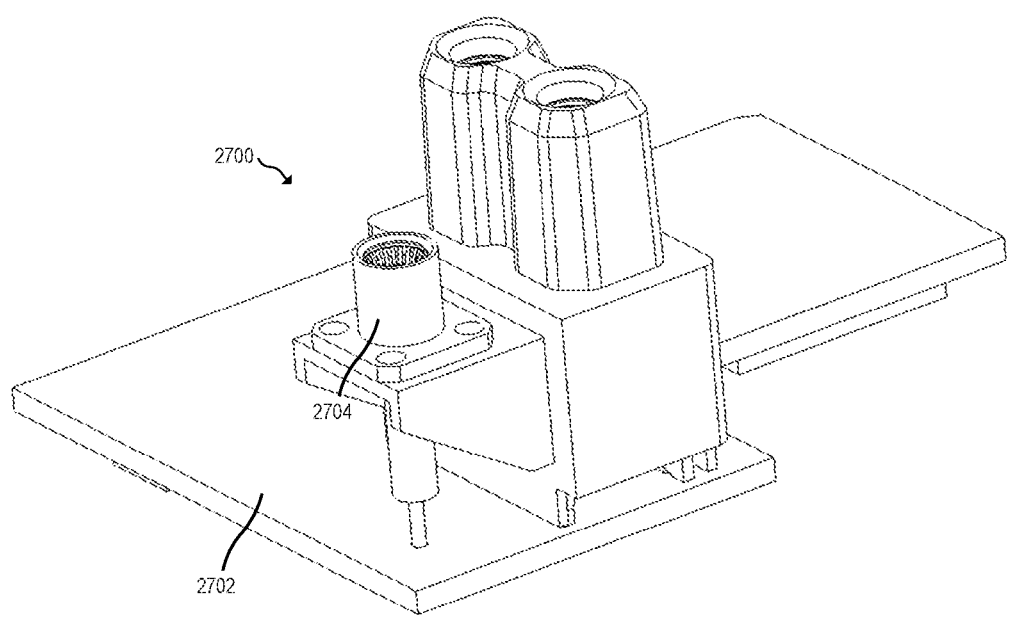

FIGS. 27A-C are schematic views of a pluggable module 2800 without a top cover, bottom cover, and cold plate, according to an example. In an example, the pluggable module 2700 may include a PCB 2702. In an example, various components may be included on the PCB 2702. In another example, the components may be opto-electronic components. In other words, electric signals generated by the components may be converted to optical signals and sent via optical connectors to other devices. In another example, optical signals received by the opto-electronic components may be converted to electric signals and then processed, modified, configured, or stored within other components on the PCB 2702. In another example, the pluggable module 2700 may include processing resources, machine-readable storage medium, management components, or some combination thereof.

In another example, management components may generate radio frequency signals to be transmitted over the radio frequency base layer (through the radio frequency connector 2704). In another example, management signals may be transmitted as optical signals over the optical connectors.

Figure 28:
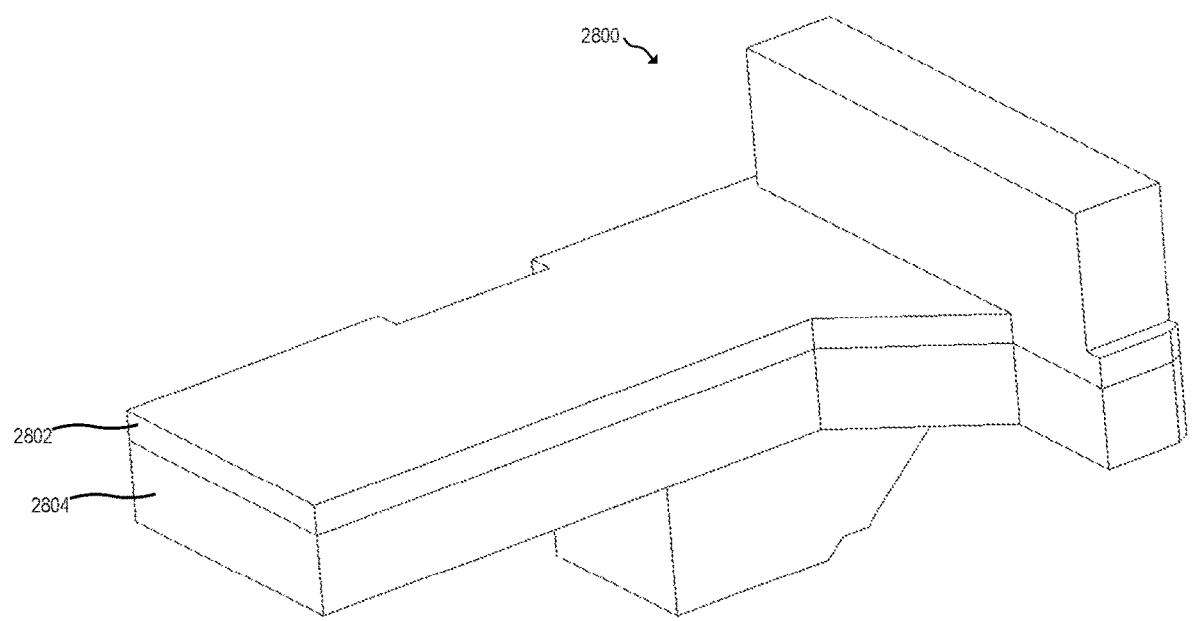
FIG. 28 is a schematic view of an optical top layer interface and optical base layer interface, according to an example.

FIG. 28 is a schematic view of an optical top layer interface 2802 and optical base layer interface 2804, according to an example. In an example, the optical base layer interface 2804 may allow for communication to the optical base layer of a computing device. In another example, an optical top layer interface 2802 may sit on top of the optical base layer interface 2804. In such examples, the optical top layer interface 2802 may allow for pluggable module intercommunication.

The present disclosure has been described using non-limiting detailed descriptions of examples thereof and is not intended to limit the scope of the present disclosure. It should be understood that features and/or operations described with respect to one example may be used with other examples and that not all examples of the present disclosure have all of the features and/or operations illustrated in a particular figure or described with respect to one of the examples. Variations of examples described will occur to persons of the art. Furthermore, the terms "comprise," "include," "have" and their conjugates, shall mean, when used in the present disclosure and/or claims, "including but not necessarily limited to."

It is noted that some of the above described examples may include structure, acts or details of structures and acts that may not be essential to the present disclosure and are intended to be examples. Structure and acts described herein are replaceable by equivalents, which perform the same function, even if the structure or acts are different, as known in the art. Therefore, the scope of the present disclosure is limited only by the elements and limitations as used in the claims

What is claimed is:

1. A computing device, comprising:
   a chassis;
   an optical base layer comprising optical connectors;
   a power base layer comprising power connectors;
   a thermal base layer comprising a cold supply line with a first set of cooling disconnects and a hot return line with a second set of cooling disconnects;
   a radio frequency base layer comprising radio frequency connectors;
   a power interface coupled to the power base layer;
   a power supply coupled to the power interface to provide power to the power base layer through the power interface; and
   a plurality of bays formed by bay divider walls comprising at least two bay divider walls perpendicular to each other, wherein a respective bay includes an area in the computing device defined by corresponding bay divider walls, wherein a respective bay divider wall of the bay divider walls is removable and separates power and thermal flows for individual bays formed by the respective bay divider wall; and
   wherein a respective bay is capable of accommodating a pluggable module and comprises one of the optical connectors, one of the power connectors, one cooling disconnect for the cold supply line from the first set of cooling disconnects, one cooling disconnect for the hot return line from the second set of cooling disconnects, and one of the radio frequency connectors.

2. The computing device of claim 1, wherein a respective bay divider wall of the bay divider walls is removable to create larger bays to accept larger pluggable modules.

3. The computing device of claim 2, wherein a subset of bays of the plurality of bays, with bay divider walls removed, accepts a 1×2 pluggable module or a 2×2 pluggable module.

4. The computing device of claim 1, wherein the radio frequency base layer is enclosed in the optical base layer.

5. The computing device of claim 1, wherein the optical base layer, thermal base layer, power base layer, and radio frequency base layer are toollessly attachable to the chassis.

6. The computing device of claim 1, wherein the optical base layer, thermal base layer, power base layer, and radio frequency base layer are toollessly removable from the chassis.

7. The computing device of claim 1, wherein the power supply comprises a plurality of redundant power supplies in the computing device.

8. The computing device of claim 1, wherein the optical base layer includes a signal interface bulkhead to connect to an optical interface slot.

9. The computing device of claim 1, wherein the hot return line transfers heated coolant of a pluggable module to a tube to leave the computing device through a hot return disconnect associated with a bay housing the pluggable module.

10. A computing device, comprising:
    a chassis comprising slots, wherein a respective slot of the slots accepts a computing device tray;
    a power supply; and
    a computing device tray power interface;
    wherein the computing device tray comprises:
      an optical base layer comprising optical connectors;
      a power base layer comprising power connectors, wherein the computing device tray power interface is coupled to the power base layer;
      a thermal base layer comprising a cold supply line with a first set of liquid disconnects and a hot return line with a second set of liquid disconnects;
      a radio frequency base layer comprising radio frequency connectors;
      a plurality of bays formed by bay divider walls comprising at least two bay divider walls perpendicular to each other, wherein a respective bay includes an area in the computing device defined by corresponding bay divider walls,
    wherein a respective bay divider wall of the bay divider walls is removable and separates power and thermal flows for individual bays formed by the respective bay divider wall; and
      wherein a respective bay is capable of accommodating a pluggable module and comprises one of the optical connectors, one of the power connectors, one liquid disconnect for the cold supply line, one of the liquid disconnects for a hot return line of the hot return lines, and one of the radio frequency connectors;
    a chassis optical interface to connect to the optical base layer;
    wherein the power interface is to provide power from the power supply to the power base layer.

11. The computing device of claim 10, wherein the plurality of bays of the computing device tray includes eight bays.

12. The computing device of claim 10, wherein the computing device includes a retention feature to lock a respective bay divider wall of the bay divider walls.

13. The computing device of claim 10, wherein the optical base layer includes a waveguide.

14. The computing device of claim 10, wherein the power base layer includes one or more bus bars that span a length of the chassis.

15. The computing device of claim 10, wherein the computing device tray includes a power conversion unit.

16. An apparatus, comprising:
    a chassis;
    an optical base layer comprising optical connectors;
    a power base layer comprising power connectors;
    a thermal base layer comprising a cold supply line with a first set of cooling disconnects and a hot return line with a second set of cooling disconnects;
    a radio frequency base layer comprising radio frequency connectors;
    a power interface coupled to the power base layer;
    a power supply coupled to the power interface to provide power to the power base layer through the power interface; and
    a plurality of bays formed by bay divider walls comprising at least two bay divider walls perpendicular to each other, wherein a respective bay includes an area in the computing device defined by corresponding bay divider walls, wherein a respective bay divider wall of the bay divider walls is removable and separates power and thermal flows for individual bays formed by the respective bay divider wall; and
    wherein a respective bay is capable of accommodating a pluggable module and comprises one of the optical connectors, one of the power connectors, one cooling disconnect for the cold supply line from the first set of cooling disconnects, one cooling disconnect for the hot return line from the second set of cooling disconnects, and one of the radio frequency connectors.

17. The apparatus of claim 16, wherein a respective bay divider wall of the bay divider walls is removable to create larger bays to accept larger pluggable modules.

18. The apparatus of claim 16, wherein the optical base layer, thermal base layer, power base layer, and radio frequency base layer are toollessly attachable to and removable from the chassis.

19. The apparatus of claim 16, wherein the power supply comprises a plurality of redundant power supplies in the apparatus.

20. The apparatus of claim 16, wherein the hot return line transfers heated coolant of a pluggable module to a tube to leave the apparatus through a hot return disconnect associated with a bay housing the pluggable module.

* * * * *